United States Patent
Dai et al.

(10) Patent No.: US 9,991,391 B2
(45) Date of Patent: Jun. 5, 2018

(54) PRISTINE AND FUNCTIONALIZED GRAPHENE MATERIALS

(75) Inventors: Hongjie Dai, Cupertino, CA (US);
Xiaolin Li, Menlo Park, CA (US);
Xiaoming Sun, Beijing (CN)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 1271 days.

(21) Appl. No.: 12/508,754

(22) Filed: Jul. 24, 2009

(65) Prior Publication Data

US 2010/0028681 A1    Feb. 4, 2010

Related U.S. Application Data

(60) Provisional application No. 61/083,791, filed on Jul. 25, 2008.

(51) Int. Cl.
*B32B 9/00* (2006.01)
*H01L 29/786* (2006.01)
(Continued)

(52) U.S. Cl.
CPC ........ *H01L 29/78684* (2013.01); *B82Y 30/00* (2013.01); *B82Y 40/00* (2013.01);
(Continued)

(58) Field of Classification Search
CPC . C01B 2204/00; C01B 2204/32; C01B 31/00; C01B 31/446; Y10T 428/30
(Continued)

(56) References Cited

U.S. PATENT DOCUMENTS 3,527,856 A  *  9/1970 Olstowski ................... 264/109
3,989,586 A     11/1976 Bashaw et al.
(Continued)

OTHER PUBLICATIONS

Kam et al. "Carbon nanotubes as multifunctional biological transporters and near-infrared agents for selective cancer cell destruction" (PNAS, Aug. 2005, IDS) (Kam).*
(Continued)

*Primary Examiner* — Daniel H Miller
(74) *Attorney, Agent, or Firm* — Brian E. Davy; Bozicevic, Field & Francis LLP

(57) ABSTRACT

Disclosed are dispersed graphene sheets, ribbons, graphene molecules and the like which are pristine in the plane, i.e., free of significant defects and chemical modifications such as oxidation. The materials could be functionalized at the edges. These materials are dispersed in solutions rather than in aggregated or insoluble forms as their parent starting materials. Also disclosed is a method comprising the steps of intercalating an insoluble graphitic material. The method may comprise exfoliating graphite and re-intercalating the resultant material with an acid composition, such as oleum, and a strong organic base such as tetrabutylammonium hydroxide in a solvent solution to form a homogenous suspension, which is then agitated to form dispersed graphene materials. The materials may be solubilized with a hydrophilic polymer and can be further manipulated by transfer into different solvents, formation of films, application to optical and electronic devices, and other applications. The materials are solubilized by functional groups mostly at the edges.

18 Claims, 16 Drawing Sheets

(51) Int. Cl.
*B82Y 30/00* (2011.01)
*B82Y 40/00* (2011.01)
*H01L 29/16* (2006.01)
*H01L 29/778* (2006.01)
*C01B 32/22* (2017.01)
*C01B 32/225* (2017.01)
*C01B 32/19* (2017.01)

(52) U.S. Cl.
CPC .............. *C01B 32/19* (2017.08); *C01B 32/22* (2017.08); *C01B 32/225* (2017.08); *H01L 29/1606* (2013.01); *H01L 29/778* (2013.01); *C01B 2204/02* (2013.01); *C01B 2204/04* (2013.01); *Y10T 428/30* (2015.01)

(58) Field of Classification Search
USPC ..................... 428/408; 423/447.1; 977/742
See application file for complete search history.

(56) References Cited

U.S. PATENT DOCUMENTS

| | | | |
|---|---|---|---|
| 3,992,562 A | | 11/1976 | Denzinger et al. |
| 4,207,893 A | | 6/1980 | Michaels |
| 4,876,077 A | * | 10/1989 | Murakami ............... 423/448 |
| 5,478,671 A | * | 12/1995 | Idota ....................... 429/221 |
| 5,624,606 A | | 4/1997 | Wilson et al. |
| 6,287,694 B1 | * | 9/2001 | Zaleski et al. ........... 428/402 |
| 6,310,149 B1 | | 10/2001 | Haddleton |
| 6,339,060 B1 | | 1/2002 | Yatvin et al. |
| 6,720,092 B2 | | 4/2004 | Hatwar |
| 6,730,334 B2 | | 5/2004 | Zhao |
| 2005/0271574 A1 | * | 12/2005 | Jang et al. ............... 423/448 |
| 2006/0134326 A1 | * | 6/2006 | Watanabe et al. ....... 427/180 |
| 2006/0275371 A1 | | 12/2006 | Dai et al. |
| 2007/0158618 A1 | | 7/2007 | Song et al. |
| 2007/0158789 A1 | | 7/2007 | Faris |
| 2009/0092747 A1 | * | 4/2009 | Zhamu et al. .............. 427/80 |

OTHER PUBLICATIONS

Kam; Biological application of Carbon Nanotubes: Paving the way to nanotube based delivery vehicles and therapies for living systems; (2006).*
Zhuang Liu, et al., "PEGylated Nano-Graphene Oxide for Delivery of Water Insoluble Cancer Drugs," Needs Citation.
Caryn Lang Bowe, et al., "Design of compounds that increase the absorption of polar molecules," Proc. Natl. Acad. Sci. USA, Oct. 1997, vol. 94, 12218-12223.
Andrew C. Grimsdale, et al., "The Chemistry of Organic Nanomaterials," Angew. Chem. Int. Ed., 2005, vol. 44, 5592-5269.
Xiaolin Li, et al., "Highly conducting graphene sheets and Langmuir-Blodgett films," Nature, Sep. 2008, vol. 3, 538-542.
Zhuang Liu, et al., "PEGylated Nano-Graphene Oxide for Delivery of Water Insoluble Cancer Drugs," J Am. Chem. Soc. Aug. 20, 2008; 130(33): 10876-10877.
Xiaoming Sun, et al., "Nano-Graphene Oxide for Cellular Imaging and Drug Delivery," Nano Res, 2008, 1:203-212, doi 10.1007/s12274-008-8021-8.
Jishan Wu, et al., "From Branched Polyphenylenes to Graphite Ribbons," Macrcolecules, 2003, 36, 7082-7089.
Sasha Stankovich, et al. "Synthesis of Graphene-based Nanosheets Via Chemical Reduction of Exfoliated Graphite Oxide," Carbon 45 (2007) 1558-1565.
Zhuang Liu, et al., "Carbon Nanotubes in Biology and Medicine: In vitro and in vivo Detection, Imaging and Drug Delivery," Nano Res, 2009, 2: 85-120.
Zhang Liu, et al., "Multiplexed Multicolor Raman Imaging of Live Cells with Isotopoically Modified Single Walled Carbon Nanotubes," J. Am. Chem. Soc. 2008, vol. 130, No. 41, 13540-13541.

* cited by examiner

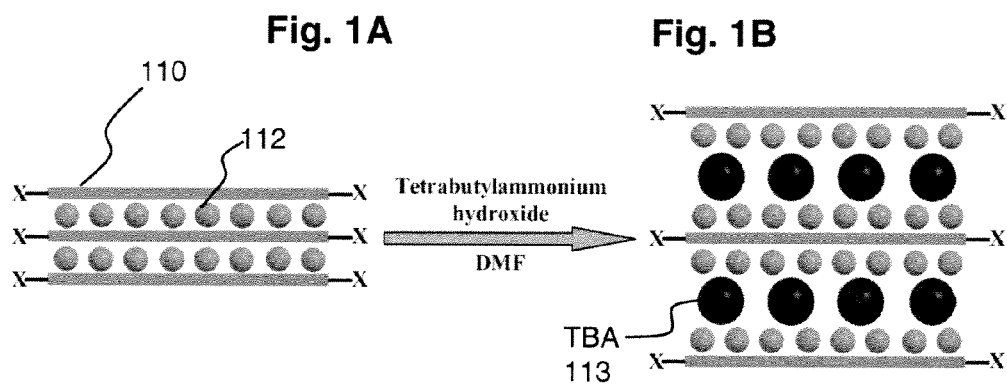

PRISTINE AND FUNCTIONALIZED GRAPHENE MATERIALS

CROSS-REFERENCE TO RELATED APPLICATIONS

This application claims priority from U.S. Provisional Patent Application No. 61/083,791, filed on Jul. 25, 2008, which is hereby incorporated by reference in its entirety.

STATEMENT OF GOVERNMENTAL SUPPORT

This invention was made with government support under grant number N00014-08-1-0860 awarded by the United States Office of Naval Research and grant number 1US54CA119367 awarded by the National Institutes of Health. The government has certain rights in the invention.

REFERENCE TO SEQUENCE LISTING, COMPUTER PROGRAM, OR COMPACT DISK

None

BACKGROUND OF THE INVENTION

Field of the Invention

The present invention relates to the field of materials and particularly to the field of graphene sheet materials.

Related Art

Presented below is background information on certain aspects of the present invention as they may relate to technical features referred to in the detailed description, but not necessarily described in detail. The discussion below should not be construed as an admission as to the relevance of the information to the claimed invention or the prior art effect of the material described.

Graphene is an intriguing material with properties that are distinct from those of other graphitic systems.[1-5] The first samples of pristine graphene were obtained by 'peeling off'[2,6] and epitaxial growth[5,7]. Recently, the chemical reduction of graphite oxide was used to produce covalently functionalized single-layer graphene oxide.[8-15] However, chemical approaches for the large-scale production of highly conducting graphene sheets remain elusive.

Several methods have been explored thus far to obtain graphene in solution phase via chemical routes. Graphite oxide (GO) was prepared by harsh oxidation using the Hummer's method.[16] The as-made GO was electrically insulating but chemical reduction[9,10,15] partially recovered the conductivity, albeit at values orders of magnitude below that of pristine graphene. Irreversible defects and disorder exist in the GO sheets.[9,10] The reduced GO exhibit non-metallic behavior, with the conductance decreasing by about three orders of magnitude upon cooling to low temperature,[13] whereas pristine graphene is nearly metallic.[2,17] Li et al. reported pristine graphene nanoribbons (GNR) obtained by sonicating thermally exfoliated graphite in a 1,2-dichloroethane (DCE) solution of poly(m-phenylenevinylene-co-2,5-dioctoxy-p-phenylenevinylene) (PmPV).[18] Nevertheless, the yield was low and most of the ribbons contained two or more layers. Despite these and other efforts,[8,15,19-22] solution phase derivation of single-layer graphene with high electrical conductivity from widely available parent graphite materials has not been achieved at a large scale. The production of stable suspensions of graphene in organic solvents is also an important goal in chemical processing and other areas.

Specific Patents and Publications

Wu et al., "From Branched Polyphenylenes to Graphite Ribbons," Macromolecules 36:7082-7089 (2003) discloses the synthesis of graphitic nanoribbons (~1 nm wide) containing extended conjugated all benzenoid segments. These were obtained by intramolecular oxidative cyclodehydrogenation of soluble branched polyphenes.

Grimsdale and Mullen, "The Chemistry of Organic Nanomaterials," Ang. Chem. Int. Ed., 44:5592-5629 (2005) discloses a variety of planar polycyclic aromatic hydrocarbons, including graphene of various numbers of benzene subunits, e.g., $C_{42}$, $C_{96}$, etc.

The materials described in the foregoing two papers were poorly soluble. The species are all in aggregation. In contrast, the methods described below are able to disperse the ribbons and graphene molecules and suspend them in solutions. Importantly, the present method can separate the sheets or planar molecules as described in these papers from one another and solubilize them in solutions.

US 20050271574 by Jang, et al., published Dec. 8, 2005, entitled "Process for producing nano-scaled graphene plates," disclose a process for producing nano-scaled graphene plates with each plate comprising a sheet of graphite plane or multiple sheets of graphite plane with the graphite plane comprising a two-dimensional hexagonal structure of carbon atoms. The process includes the primary steps of: (a) providing a powder of fine graphite particles comprising graphite crystallites with each crystallite comprising one sheet or normally a multiplicity of sheets of graphite plane bonded together; (b) exfoliating the graphite crystallites to form exfoliated graphite particles, which are characterized by having at least two graphite planes being either partially or fully separated from each other; and (c) subjecting the exfoliated graphite particles to a mechanical attrition treatment to further reduce at least one dimension of the particles to a nanometer scale, <100 nm, for producing the nano-scaled graphene plates.

Li et al. "Chemically Derived, Ultrasmooth Graphene Nanoribbon Semiconductors," *Science*, 319:1229-1232 (2008) (Reference 18 above) describes the production of nanoribbons using exfoliated graphite dispersed into 1,2-dichloroethane (DCE) solution. This method does not disclose the use of intercalation, and the use for solubilization of PmPV (poly(m-phenylenevinylene-co-2,5-dioctyloxy-p-phenylenevinylene) dispersant. Described there, by authors including the present inventors, is a chemical route to produce graphene nanoribbons (GNR) with width below 10 nanometers, as well as single ribbons with varying widths along their lengths or containing lattice-defined graphene junctions for potential molecular electronics. The GNRs were solution-phase derived, stably suspended in solvents with non-covalent polymer functionalization, and exhibited ultra-smooth edges with possibly well-defined zigzag or arm-chair edge structures. Electrical transport experiments showed that unlike single-walled carbon nanotubes, all of the sub-10 nanometer GNRs produced were semiconductors and afforded graphene field effect transistors (FET) with on-off ratios ~$10^7$ at room temperature. The graphene nanoribbons (GNR) discussed below in connection with the present invention are preferably like the exemplified graphene sheets, only the ribbons have narrow widths (<~10 nm) and atomically smooth edges, which are predicted to exhibit band gaps useful for room temperature transistor operations with excellent switching speed and high carrier mobility (potentially even ballistic transport).

As will be described below, the GNRs of the present process are first made by organic synthesis, using synthetic methods as described e.g., by Wu et al., and Grimsdale and Mullen, supra. However, to prevent resulting materials from being in insoluble aggregated form, the present process uses oleum/TBA treatment to make the GNRs soluble and well dispersed from the aggregates. The same methods described below also make large graphene molecules such as C222 and C42 as described by the Mullen group dispersed and soluble. This is similar to making graphene nanosheets soluble and dispersed from the starting material.

BRIEF SUMMARY OF THE INVENTION

The following brief summary is not intended to include all features and aspects of the present invention, nor does it imply that the invention must include all features and aspects discussed in this summary.

Described below are highly conducting graphene sheets and ribbons, as well as graphene molecules and the like which are pristine, i.e., free of significant defects and chemical modifications within the plane of the structures, such as oxidation. The term "pristine" is used in its accepted meaning in the art (see, e.g., Carbon 45(2007) 1558-1565) in accordance with the foregoing description. The edges of the structures of the present invention are functionalized, i.e., they contain chemical modifications, which improve solubility. Also disclosed is a method of making a graphene material dispersed in solution, which material is a single atom thick, and contains functional groups, comprising the steps of: providing as a starting material a graphitic material, which may be a graphene sheet, ribbon, or small molecule such as pentacene, coronene, C42, etc. in aggregated or insoluble form; then intercalating this starting material with an acid forming a suspension in a liquid medium; and agitating the suspension to form dispersed graphene material reacted with the acid to form said functional groups, whereby one may recover graphene material as separate molecules from the solution. The small molecules used were C42 and C22, but could be Cn, where n is between about 42 and 222. In other aspects, the invention comprises exfoliating graphite and re-intercalating the resultant material with an acid composition, such as oleum, and a strong organic base such as tetrabutylammonium hydroxide in an organic solvent solution to form a homogenous suspension, which is then agitated to form materials of the desired size. The materials can be further manipulated by transfer into different solvents, formation of films, application to optical and electronic devices, and other applications.

The present invention has an important aspect in that it enables one to make single species of molecules dispersed in solvents, using starting materials that are insoluble. This dispersion and solubility are key technical improvements. Aggregated ribbons, molecules and graphene have been previously known, but not in functionalized, stable suspensions (referred to also as solutions).

Thus, in one aspect, the present invention comprises a method of making a graphene material dispersed in solution, which material is a single atom thick, comprising the steps of exfoliating expandable graphite to form exfoliated graphite; intercalating the exfoliated graphite with an acid and an organic base; forming a suspension in a liquid medium; agitating the suspension to form dispersed sheets, ribbons or large graphene molecules; and recovering the respective sheets, ribbons and large graphene molecules. The method is applicable to a number of graphitic or planar polyaromatic molecules, such as graphene sheet, graphene nanoribbon, or polyacene molecules. In the method, one uses an intercalating acid, which may comprise oleum. The organic base may comprise TBA. The agitation step may comprise sonication. In one aspect, the invention further comprises the step of reducing the recovered sheets to obtain nearly pristine graphene material. In one aspect, the invention further comprises the step of attaching the recovered sheet to an electrical device, such as a transistor. In one aspect, the invention further comprises the preparation of sheet like materials obtained from the above process in an organic solvent and contacting them with an aqueous phase to prepare an LB ("Langmuir-Blodgett") film. This approach may be used, e.g., to prepare transparent electrodes for use in solar or photovoltaic devices. In one aspect, the invention further comprises the step of attaching the recovered sheet to a transparent substrate. Again, the substrate may be a window or lens in an optical or photovoltaic device. In one aspect, the invention further comprises an additional solubilization aspect where the recovered sheet is attached to a hydrophilic polymer molecule, preferably numerous molecules. This polymer molecule serves to solubilize the graphene material. It may be PEG. In one aspect, the invention further comprises attaching a number of PEG molecules to the graphene material where the PEG is linked to the recovered sheet by a lipid. The lipid is bound to the graphene by hydrophobic forces.

In one aspect, the invention further comprises unique materials where a graphene sheet, ribbon or polyphenylene molecule (graphene molecule) is pristine in the interior of the plane and functionalized at the edges. That is, as described in detail below, the interior of the molecule contains few if any missing atoms or bonds, and no additional atoms, while the edge contains other atomic species. This material, i.e., graphene sheet, may be further bound to a hydrophilic polymer. In certain aspects of the invention, the graphene material is bound to PEG, possibly through a lipid, which is hydrophobically adsorbed onto the surface of the graphene material. In one aspect of the invention, the material is on a transparent substrate, such as quartz crystal, glass, a preformed sheet of graphene, etc. In one aspect of the invention, the material is on a substrate and attached to an electrode.

BRIEF DESCRIPTION OF THE DRAWINGS

FIG. 1 is a series of schematic drawings showing chemically derived single layer graphene sheets (GS) from solution phase according to the present process. FIG. 1A is a schematic drawing of exfoliated graphite sheets 110 (marked with an x) re-intercalated with sulphuric acid molecules (112) between the layers. FIG. 1B shows a resulting structure having TBA molecules 113 interspersed between the sheets. This shows TBA (black spheres) insertion into the intercalated graphite.

FIG. 3 illustrates differences between graphene sheets versus graphene oxide sheets.

FIG. 17B shows fluorescence spectra of oleum treated C42 (in DMF). FIG. 17C shows a schematic structure of C222.

DETAILED DESCRIPTION OF THE PREFERRED EMBODIMENT

Overview

Definitions

Figure 1C:
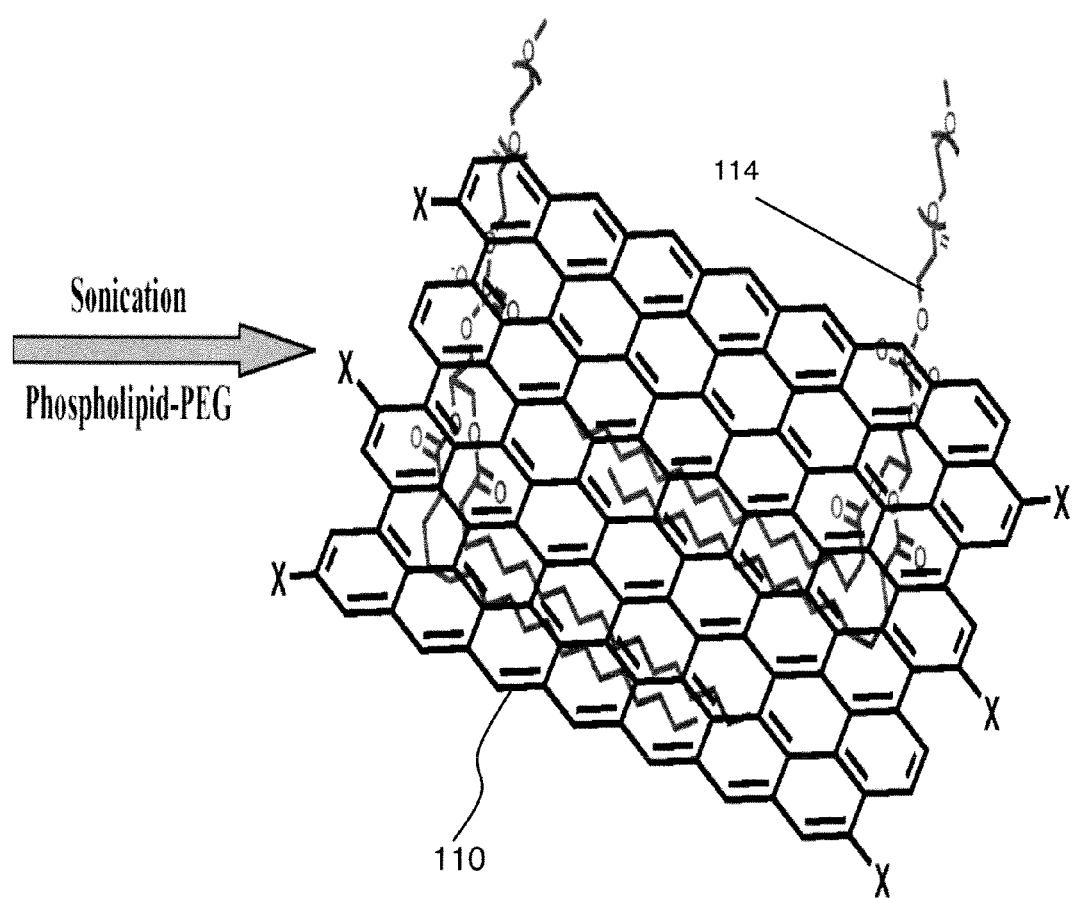
FIG. 1C is a schematic drawing of GS coated with two DSPE-mPEG (lipid-hydrophilic polymer) molecules 114.

Unless defined otherwise, all technical and scientific terms used herein have the same meaning as commonly understood by those of ordinary skill in the art to which this invention belongs. Although any methods and materials similar or equivalent to those described herein can be used in the practice or testing of the present invention, the preferred methods and materials are described. Generally, nomenclatures utilized in connection with, and techniques of, physics and chemistry are those well known and commonly used in the art. Certain experimental techniques, not specifically defined, are generally performed according to conventional methods well known in the art and as described in various general and more specific references that are cited and discussed throughout the present specification. For purposes of the clarity, following terms are defined below.

The term "graphitic material" means a material such as graphite, graphene ribbons, graphene molecules or other polyaromatic/conjugated molecules, which is in aggregated or insoluble form. It is used here to refer to the starting material, which is in aggregate form, as opposed to the resultant graphene material.

The term "graphene material" means a material which is a one-atom-thick planar sheet of $sp^2$-bonded carbon atoms that are densely packed in a honeycomb crystal lattice, and, further, contains an intact ring structure of carbon atoms and aromatic bonds throughout at least a majority of the interior sheet and lacks significant oxidation modification of the carbon atoms. The graphene material may contain non-carbon atoms at its edges, such as OH and COOH functionalities. Preferably at least 90% of the interior aromatic bonds are intact. The present pristine graphene material is distinguishable from graphene oxide in that it has a lower degree of oxygen containing groups such as OH, COOH and epoxide. The present graphene material may include sheets and graphene ribbons, the two being distinguishable by size, with a ribbon typically having a relatively narrow width, which can be as low as about 10 nm. Graphene ribbons are thin strips of graphene or unrolled single-walled carbon nanotubes. The graphene ribbons were originally introduced as a theoretical model by M. Fujita et al. to examine the edge and nanoscale size effect in graphene. Their electronic states largely depend on the edge structures (armchair or zigzag). The graphene ribbons have a width of not more than about 100 nm. As used here, the term "graphene material" includes not only graphene sheets and ribbons, but "polyphenylene molecules," i.e., polyaromatic carbon molecules having at least two fused benzene rings, further having additional benzyl groups which may be fused or dendrimeric. These molecules are exemplified by way of the polyacene (pentacene, rubrene, coronene) and C222 and C42 molecules described below.

The term "pristine graphene material" means a graphene material having no significant density of oxygen containing groups or other non-carbon atoms in the plane of the graphene, and very few broken bonds or missing atoms.

The term "oleum" means a corrosive solution of sulfur trioxide in sulfuric acid. Oleums can be described by the formula $xSO_3.H_2O$ where x is the total molar sulfur trioxide content. The value of x can be varied, to include different oleums. They can also be described by the formula $H_2SO_4.xSO_3$ where x is now defined as the molar free sulfur trioxide content. Oleum is generally assayed according to the free $SO_3$ content by weight.

The term "TBA" means tetrabutylammonium hydroxide, with the formula $(C_4H_9)4NOH$, CAS number 2052-49-5. This species is not readily obtainable as a pure compound, but it employed as a solution in water or alcohols. It is commonly used as a base in organic chemistry.

The term "functionalized" is used in its accepted sense in the nanomaterials area, and involves attaching chemicals to nanostructured materials to change the properties of the nanostructured materials such as the electron or hole concentration or to affect other properties. Generally, relatively strong binding to graphene is required in order to create a stable structure, where the molecules are not removed by a liquid, mechanical effects and the like. Examples of functionalizing groups in the present invention include oxide, epoxide, carboxyl and hydroxyl groups. The present functionalization will impart solubility and will generally be an oxygen-containing group. These groups may be replaced by known chemistries, given the present teachings. Thus the term "functional group," in the present context of a graphene material having functional groups, means that the material has covalently bound to a number of the graphitic ordered carbon atoms, typically by replacing a hydrogen bonded to the carbon, one or more elements which make up groups known in organic chemistry to be capable of reacting to form derivatives, as exemplified above.

The term "hydrophilic polymer" means a material that has the property of dissolving in, absorbing, or mixing easily with water, and comprises repeating units constituting an MW of at least 200 (e.g., PEG 200) up to 8,000 or more. Hydrophilic polymers include PEG as well as other materials, which can be used to solubilize the present graphene materials. Materials for this purpose include poly(hydroxyalkyl methacrylates), poly(N-vinyl-2-pyrrolidone), anionic and cationic hydrogels, polyelectrolyte complexes, poly (vinyl alcohol) having a low acetate residual and crosslinked with glyoxal, formaldehyde, or glutaraldehyde, methylcellulose cross-linked with a dialdehyde, a mixture of agar and sodium carboxymethyl cellulose, a water-insoluble, water-swellable copolymer produced by forming a dispersion of finely divided copolymer of maleic anhydride with styrene, ethylene, propylene, butylene or isobutylene crosslinked with from about 0.001 to about 0.5 mole of a polyunsaturated cross-linking agent per mole of maleic anhydride in the copolymer as disclosed in U.S. Pat. No. 3,989,586, water-swellable polymers of N-vinyl lactams as disclosed in U.S. Pat. No. 3,992,562, and the like (See U.S. Pat. No. 4,207,893 to Michaels, issued Jun. 17, 1980, entitled "Device using hydrophilic polymer for delivering drug to biological environment.") A preferred polymer is dextran, which may be branched. The dextran straight chain consists of $\alpha1\text{->}6$ glycosidic linkages between glucose molecules, while branches begin from $\alpha1\text{->}3$ linkages (and in some cases, $\alpha1\text{->}2$ and $\alpha1\text{->}4$ linkages as well). One may apply Dextran 10, Dextran 40 and Dextran 70 (Mw=10,000, 40,000 and 70,000, respectively) at a concentration analogous to those described for PEG.

Hydrophilic polymers suitable for use herein include polyethylene glycol (PEG), polyoxyethylene, polymethylene glycol, polytrimethylene glycols, polyvinyl-pyrrolidones, poly lysine (D or L) and derivatives thereof with PEG being particularly preferred. The polymers can be linear or multiply branched, and will not be substantially crosslinked. Other suitable polymers include polyoxyethylene-polyoxypropylene block polymers and copolymers. Polyoxyethylene-polyoxypropylene block polymers having an ethylene diamine nucleus (and thus having four ends) are also available and may be used in the practice of the invention.

The hydrophilic polymer used here will render the graphene materials soluble when attached thereto in sufficient numbers. A precise hydrophobic/hydrophilic measurement can be made as described in Bowe et al., "Design of compounds that increase the absorption of polar molecules," *Proc. Natl. Acad. Sci. USA*, Vol. 94, pp. 12218-12223, October 1997.

The hydrophilic polymer may be PEG having 4 branches, thus providing three attachment sites for the active agent. For example, 2, 3, 4 and 8 arm branched PEGs are available from NOF Corporation, Tokyo Japan. Further description of multi-arm hydrophilic molecules is found in "Multi-arm block copolymers as drug delivery vehicles," U.S. Pat. No. 6,730,334.

The term "organic amphiphilic molecule" means an amphiphile containing a hydrophobic portion, such as an alkyl group of at least 3 carbon atoms, linked to a hydrophilic portion, e.g., a hydrophilic polymer, for stabilizing the molecule in aqueous solution. The alkyl group may be a lipid attached to a polar head group, which itself is hydrophilic or is bonded to a hydrophilic polymer. The hydrophilic polymer is preferably a polymer such as PEG.

The term "PEG" means Polyethylene glycol, a polymer with the structure $(-CH_2CH_2O-)_n$ that is synthesized normally by ring opening polymerization of ethylene oxide. The PEG used herein will impart water solubility to the graphene materials and lipid portion of the polar lipid. The polymer is usually linear at molecular weights (MWs)≤10 kD. The PEG used here will have an MW below 5,400, preferably below 2,000, or about 45 repeating ethylene oxide units. However, the higher MW PEGs (higher "n" repeating units) may have some degree of branching. Polyethylene glycols of different MWs have already been used in pharmaceutical products for different reasons (e.g., increase in solubility of drugs). The PEG used here should be attached to the graphene materials at a density adjusted for the PEG length. For example, with PL-PEG 2000, we have an estimate of ~4 nm spacing between PEG chains along the tube. At this spacing, PEG5400 is too long and starts to block interaction with the cell surface. For PEG at ~1 nm distance, the PEG MW should be less than about 200, to allow hydrophobicity.

For coupling proteins to PEG, usually monomethoxy PEG $[CH_3(-O-CH_2-CH_2)_n-OH]$ is first activated by means of cyanuric chloride, 1,1'-carbonyldiimidazole, phenylchloroformate, or succidinimidyl active ester before the addition of the protein. In most cases, the activating agent acts as a linker between PEG and the protein, and several PEG molecules may be attached to one molecule of protein. The pharmacokinetics and pharmacodynamics of the present nanotubes-PEG-protein conjugates are expected to be somewhat dependent on the MW of the PEG used for conjugation. Generally the presently used PEG will have a molecular weight of approximately 100-2,000 Daltons.

The present PEG may also be modified PEG such as Polyp® (Warwick Effect Polymers, Ltd., Coventry, England), which is new range of materials suitable for the attachment of polyethylene glycol (PEG) to therapeutic proteins or small molecules. These are prepared using Warwick Effect Polymers' polymerization technology, (See U.S. Pat. No. 6,310,149) and contain terminal groups suitable for conjugation with, among other things, lysine, terminal amino and cysteine residues.

The term "polar lipid" refers to a molecule having an aliphatic carbon chain with a terminal polar group. Preferred polar lipids include but are not limited to acyl carnitine, acylated carnitine, sphingosine, ceramide, phosphatidyl choline, phosphatidyl glycerol, phosphatidyl ethanolamine, phosphatidyl inositol, phosphatidyl serine, cardiolipin and phosphatidic acid. Further polar lipids are exemplified in U.S. Pat. No. 6,339,060, "Conjugate of biologically active compound and polar lipid conjugated to a microparticle for biological targeting," to Yatvin, et al., hereby incorporated by reference.

The term "phospholipid" means a molecule having an aliphatic carbon chain with a terminal phosphate group. Typically the phospholipids will comprise a glycerol backbone, attached to two fatty acid (aliphatic groups) esters and an alkyl phosphate. Suitable phospholipids for use in this invention include, without limitation, dimyristoyl phosphatidylcholine, distearoyl phosphatidylcholine, dilinoleoyl-phosphatidylcholine (DLL-PC), dipalmitoyl-phosphatidylcholine (DPPC), soy phophatidylchloine (Soy-PC or PCs) and egg phosphatidycholine (Egg-PC or PCE). Suitable phospholipids also include, without limitation, dipalmitoyl phosphatidylcholine, phosphatidyl choline, or a mixture thereof. Exemplified below are 1,2-dipalmitoyl-sn-glycero-3 phosphoethanolamine phospholipid and 1,2-Distearoyl-sn-Glycero-3-Phosphoethanolamine.

The term "stable" means a solution or suspension in a fluid phase wherein solid components (i.e., graphene materials) possess stability against aggregation sufficient to allow manufacture and storage, preferably for at least about 30 days.

General Description of Methods and Materials

Described below are methods involving exfoliation-reintercalation-expansion of graphite in a method that can produce high-quality single-layer graphene sheets (GS) stably suspended in organic solvents. The GS can be suspended in water and organic solvents alike, including solvents like chloroform. The graphene sheets exhibit high electrical conductance at room and cryogenic temperatures. Large amounts of graphene sheets in organic solvents are made into large transparent conducting films by Langmuir-Blodgett (LB) assembly in a layer-by-layer manner, up to many layers. This is made possible by the fact that the GS are soluble or well suspended in organic solvents. The chemically derived high quality graphene sheets could lead to future scalable graphene devices. Importantly, this method can also be used for produce dispersed graphene nanoribbons and molecules in solvents by separating them from starting materials that are insoluble solids.

Preparation of Graphene Sheets (GS)

As described in more detail below, to make high quality graphene sheet (GS), we started by first exfoliating commercial expandable-graphite (160-50N, Grafguard Inc.) by brief (60 s) heating to 1000° C., in forming gas (3% hydrogen in argon). Heat expandable graphite is formed by treating crystalline graphite, which is composed of stacks of parallel planes of carbon atoms, with intercalants such as sulfuric acid and/or nitric acid. When the intercalated graphite is exposed to heat or flame, the inserted molecules decompose and release gases. The graphite layer planes are forced apart by the gas and the graphite expands, thereby creating a low-density, non-burnable, thermal insulation.

We then ground the exfoliated graphite, re-intercalated the material with an oleum material (fuming sulfuric acid with 20% free $SO_3$), and inserted tetrabutylammonium hydroxide (TBA, 40% solution in water) into oleum intercalated graphite (FIG. 1A) in N,N-dimethylformamide (DMF). We then sonicated the TBA (113)-inserted oleum (112)-intercalated graphite (110) (FIG. 1B) in a DMF solution of 1,2-distearoyl-sn-glycero-3-phosphoethanolamine-N-[methoxy (polyethyleneglycol)-5000] (DSPE-mPEG) for 60 mins to form a homogeneous suspension. Centrifugation was used to remove large pieces of materials from the supernatant (FIG. 1C). This method easily obtained large amounts of graphene sheets suspended in DMF and could be transferred to other solvents including water and organic solvents.

Figure 1D:
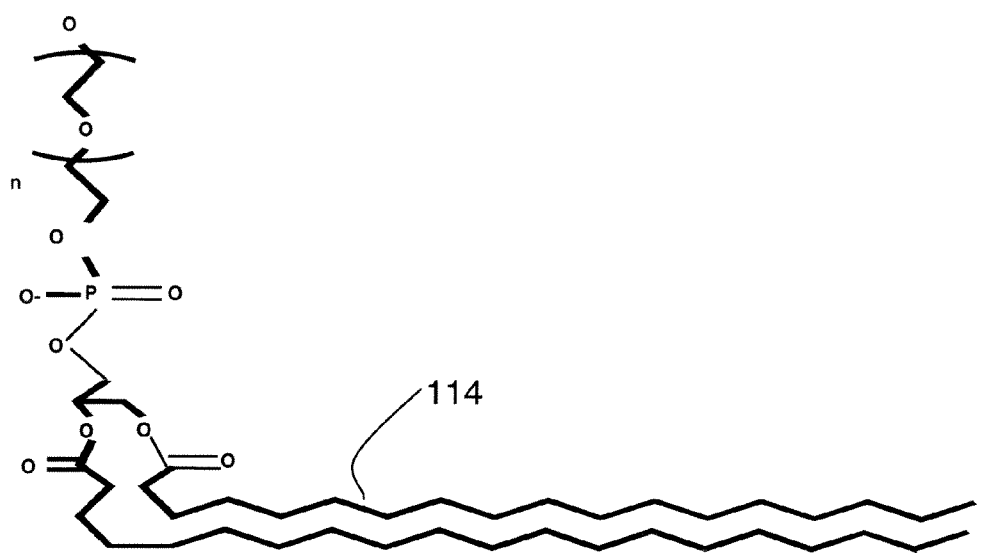
FIG. 1D is a schematic drawing of phospholipid-PEG molecule 114 in isolation.

PL-PEG 114 helps to suspend the sheets 110. The sheets can be obtained without using PL-PEG, but the suspension is not stable for many hours, i.e., overnight. As shown in FIG. 1C and in detail in FIG. 1D, the exemplary PL-PEG comprises two alkyl chains (C17 and C19 being shown) connected by ester linkages to a head carbon which is in turn bonded to a phosphate group. The phosphate group is bonded to PEG having "n" subunits, where n is preferably 45, as described above.

The exemplified method uses chemical intercalation of sulfuric acid and nitric acid.[24] Upon heating, the graphite exfoliated violently due to volatile gaseous species released from the intercalant. Most of the exfoliated graphite was still in multi-layer graphene form.[25] In order to get single layer graphene sheets, the present method employs re-intercalation by oleum, a chemical known to strongly debundle carbon nanotubes due to intercalation.[26] TBA was a molecule capable of inserting and expanding the distance between heavily oxidized graphite layers.[27] Without wishing to be bound by any scientific theory, we suggest that TBA also inserted into oleum-intercalated graphite to increase the distance between adjacent graphitic layers (FIG. 1A), which facilitated the separation of graphene sheets upon sonication in a surfactant solution.[27]

Without the TBA treatment step, the yield of single layer GS was extremely low by the otherwise identical method. Oleum material treatment was also a necessary step in the exemplified methods. We also found that DMF was a better solvent than water for our method. Further, DSPE-mPEG was a surfactant capable of suspending nanotubes, and was another important factor to obtaining homogeneous suspension of GS.

The weak oleum treatment condition (soaking in oleum at room temperature for one day) is important to obtain high quality GS without excessive chemical functionalization and thus property degradation. The conjugate graphene plane is largely free of irreversible modifications through the treatment steps.

In general, one starts with expandable graphite and exfoliates it, that is, strips the layers into individual single atom thick sheets. This step is done by heating, which may be done under a variety of conditions, as the exfoliation of expandable graphite, by itself, is known. The resultant material is ground. Grinding helps to increase the sheet yield.

Whether using expandable graphite, other graphite, or an aggregated polyphenylene molecule or nanoribbon, the starting material (after any expansion) is placed into a particular composition of a strong acid. In the case of a sheet like starting material, an organic base is also added, and this intercalates between the layers, preventing re-aggregation. The strong acid may be an oleum mixture, sulfur trioxide or $H_2SO_4$ and $HNO_3$ (oleum is 98% $H_2SO_4$ with 20% free sulfur trioxide) or $H_2SO_4$ and sodium nitrate. The strong acid functionalizes the graphitic starting material, preferably by oxidation. Various components of oleum are important for this. Components may include sulfuric acid, fuming disulphuric acid, dithionic acid, pyrosulfuric acid, and a mixture of sulfuric acid and sulfur trioxide. Oleum, is a hazardous material and has a pH<1 at 1 wt/wt %. Other materials may be substituted for the oleum as long as they have a low pH (e.g., less than 3) and an oxidizing capability in reacting with graphitic carbon molecules. Alternative acids include chlorosulfonic acid, triflic acid, fluorosulfonic acid, perchloric acid, anhydrous HF, Bronsted acid/Lewis acid complexes, and combinations thereof. Bronsted acid/Lewis acid complexes include $HSO_3F/SbF_5$), $HF/SbF_5$, $HCl/AlCl_3$, $HF/BF_3$, and combinations thereof. The starting material is well dispersed in the acid media; the acid may be in an organic solvent; and no other reactants are needed.

As described more fully below, the use of expandable graphite is not necessary; it is preferred for use in making graphene sheets. Similarly, when using aggregated small molecules as a starting material, the base need not be added to the mixture. The base will help separate the graphene sheets when there exists strong binding between the sheets. It is not necessary in the case of small molecules.

The base may be TBA or another base, such as tetramethylammonium hydroxide solution, tetraethylammonium hydroxide, tetrahexylammonium hydroxide solution, etc.

The acid, base and exfoliated graphite are placed in a nonpolar organic solvent, such as DMF or NMP The mixture is agitated, as by sonication, and individual sheets may be recovered, each a single atom layer thick.

A solubilizing hydrophilic material is attached prior to recovery, such as PEG or other hydrophilic polymer, which may be attached to the graphene sheet by a number of methods, either covalently or, preferably, removable by absorption onto a hydrophobic polymer, such as a lipid.

To obtain the pristine materials, thermal annealing was used. Alternatively, other reducing conditions may be used to remove oxygen species from the sheet, such as hydrazine ($N_2H_4$), $NaBH_4$ or other reducing agents.

Preparation of Related Materials

As illustrated in Example 5, the presently described process may also be used to prepare other carbon sheet-like materials. These include graphene nanoribbons, polyacene molecules, and related polyaromatic planar molecules. Graphene nanoribbons are described in Li et al., "Chemically Derived, Ultrasmooth Graphene Nanoribbon Semiconductors," *Science*, 319: 1229-1232 (2008), referenced above.

Polyacene molecules have the general formula

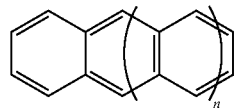

Its members to date are: naphthalene (n=0), anthracene (n=1), tetracene (n=2), pentacene (n=3), hexacene (n=4), heptacene (n=5).

Example 5 shows the preparation of graphene nanoribbons, pentacene, rubrene, coronene, C222 and C42. These molecules are not functionalized, but when treated according to the method described below, they are soluble. Pentance, C222, and C42 are soluble in DMF. Rubrene, coronene are soluble in water. These molecules were all prepared in stable suspensions, without individual molecules being aggregated together.

With these materials, one begins with a graphitic material, which is exfoliated under suitable conditions. The exfoliation of graphite is a phase transition involving the vaporization of the intercalate in the graphite. Exfoliated graphite is an expanded graphite with a low density. Graphite exfoliation has been known in the prior art for other purposes. An intercalation compound is first synthesized using reactants with strong redox properties. The intercalated graphite is then heated and the exfoliation occurs. In the prior art processes, a graphite vermicular powder is obtained.

Characterization of Resultant Graphene Sheets and Annealing

Figure 3A:
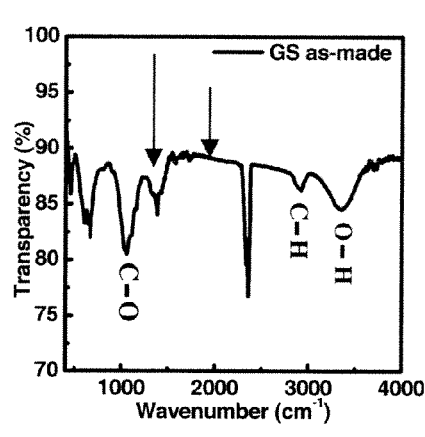
FIG. 3A shows an IR spectrum (400-4000 $cm^{-1}$) of as-made GS. The region between the arrows is from about 1400 to 1900 $cm^{-1}$ showing the signal of carboxylic groups.
Figure 3B:
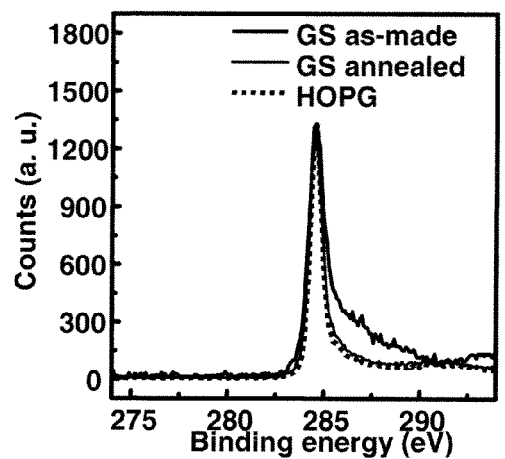
FIG. 3B shows an XPS spectra of as-made, annealed GS and a HOPG crystal. Note the similarity between the spectra of the annealed GS and highly oriented pyrolytic graphite (HOPG).
Figure 5A:
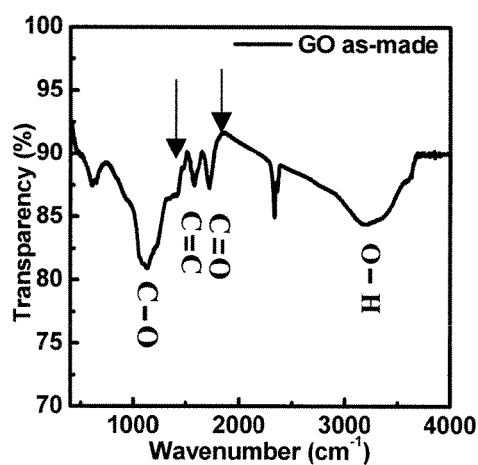
FIG. 5A shows the IR spectrum (400-4000 $cm^{-1}$) of as-made GO. The region between the arrows is from about 1400 to 1900 $cm^{-1}$ showing the signal of carboxylic groups.
Figure 5B:
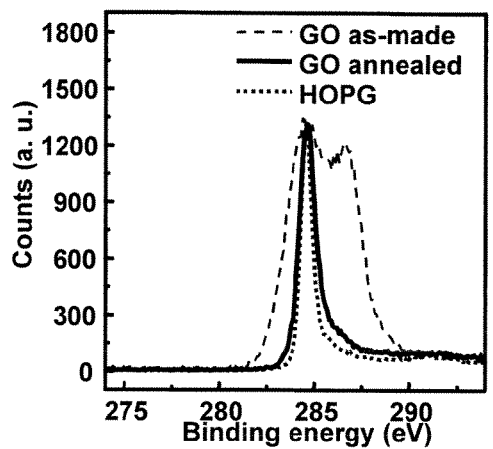
FIG. 5B shows and XPS spectra of as-made, annealed GO and a HOPG crystal.

Room temperature oleum treatment is much less oxidative than the Hummer's method, evidenced by the as-made GS exhibiting significantly fewer functional groups (FIGS. 3A and 3B) than as-made Hummer's GO (FIGS. 5A and 5B) in infrared (IR) spectra. The IR spectrum of as-made GS (FIG. 3A) showed weaker signals of carboxylic groups than the Hummer's GO (between arrows in FIGS. 3A and 5A)[29]. X-ray photoelectron spectroscopy (XPS) (FIG. 3B) of the as-made GS showed small but noticeable signals at higher binding energy corresponding to small amount of C—O species.[9, 29] These species were removed by 800° C. $H_2$ annealing, indicating the formation of high quality graphene (FIG. 3B). The annealed GS exhibited the same XPS spectrum as a pristine highly oriented pyrolytic graphite (HOPG) crystal (FIG. 3B), confirming the lack of significant defects or covalently modifications of sp2 carbon in the final GS product.

Schematic Structures

Figure 4:
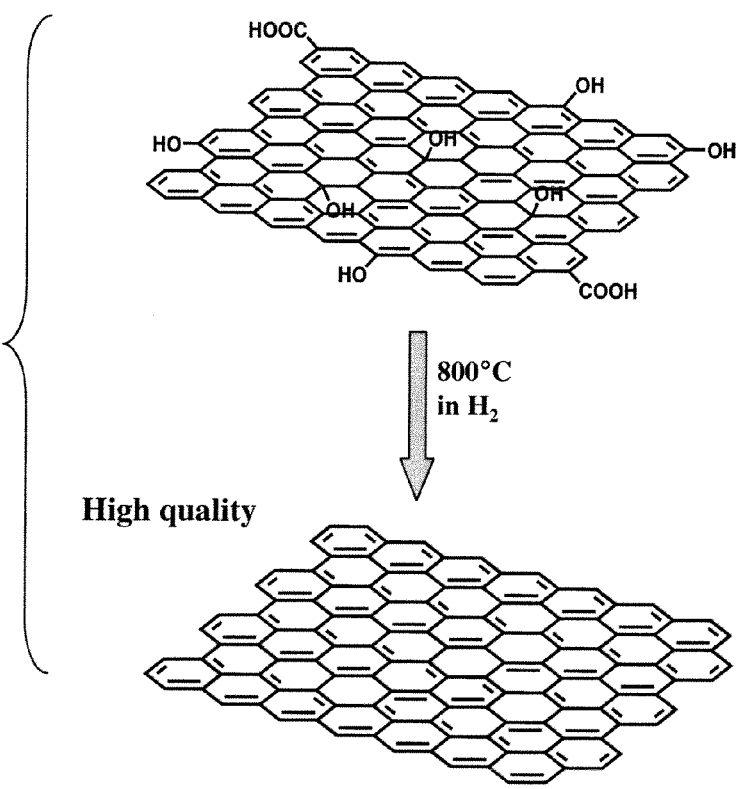
FIG. 4 is a schematic drawing of the atomic structure of as-made and annealed GS, i.e., after the illustrated heating and $H_2$.
Figure 6:
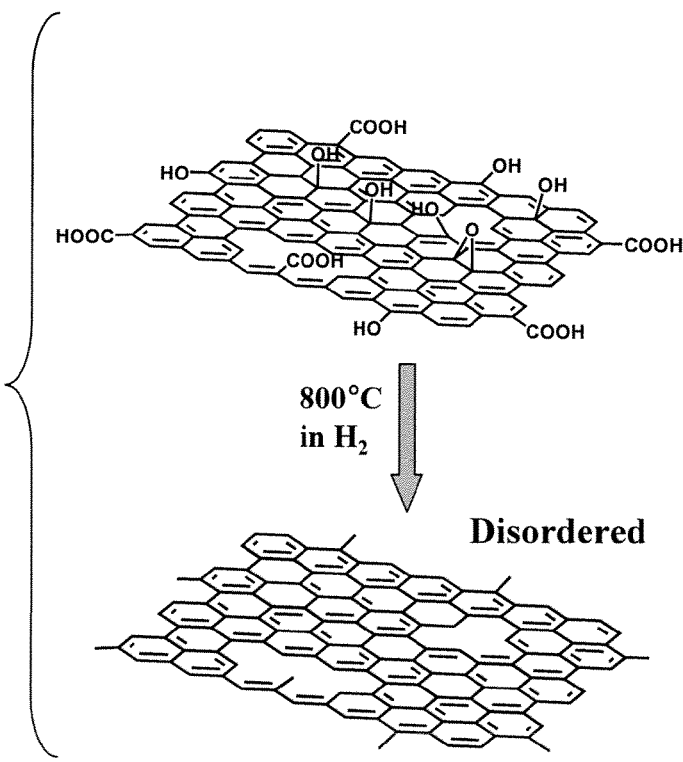
FIG. 6 is a schematic drawing of the atomic structure of as-made and annealed GO.

Schematic structures of the intermediate and final product of the GS and Hummer's GO are shown in FIG. 4 and FIG. 6. This schematic illustrates that oxidization of the intermediate, as-made GS was relatively mild and the few covalently attached functional groups such as carboxylic group (seen in the IR spectrum FIG. 3A) and hydroxyl group were most likely at the edges of as-made GS (FIG. 4), which is otherwise pristine. This view of the structure was supported by the fact that the as-made GS showed similar electrical conductivity as 800° C. vacuum-annealed GS (see FIGS. 9 and 10), an unlikely result if the graphene plane was heavily modified covalently. The Hummer's GO was heavily oxidized, as shown in the schematic structure at FIG. 6, with disrupted conjugation in the plane, missing carbon atoms in the plane,[30] and abundant functional groups such as epoxide, hydroxyl, carbonyl and carboxyl groups at both the edges and in the plane.[9, 10] Importantly, these abundant functional groups weaken the van der Waals interactions between the layers of GO and make them hydrophilic, which is the reason of single-layer GO exfoliation in aqueous media to form stable suspensions without the need of insertion agent such as TBA or the assistance of surfactant for suspension. Thermal annealing removed some of the functional groups but was unable to completely repair the holes and other irreversible defects formed within the plane of Hummer's GO sheets (FIG. 6).[9, 10]

Characterization Showing Single Layer GS

Figure 2A:
FIG. 2A is an AFM image of typical GS with size of about several hundred nanometers and topographic height of about 1 nm. Scale bar is 300 nm.
Figure 2B:
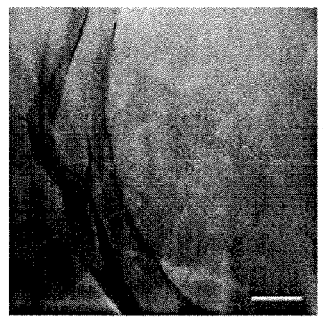
FIG. 2B shows low magnification TEM images of a typical GS with the size of about several hundred nanometers. Scale bar is 100 nm.
Figure 2C:
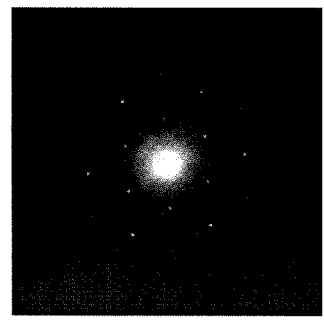
FIG. 2C shows an electron diffraction (ED) pattern of an as-made GS in FIG. 2B showing excellent crystallization of the GS.

Atomic force microscopy (AFM) was to characterize the materials deposited on substrates from the supernatant and observed ~90% single layer GS with various shapes and sizes (FIG. 2A). For over hundreds of graphene sheets measured, we found that the single-layer GS have an average size of about 250 nm and topographic height of ~1 nm. Transmission electron microscopy (TEM, FIG. 2B) and electron diffraction (ED, FIG. 2C) were used to characterize the single layer GS. The ED pattern of our GS was similar to that of 'peeled off' graphene,[23] suggesting well-crystallized single layer graphene structure.

GS Electrical Devices

Figure 8:
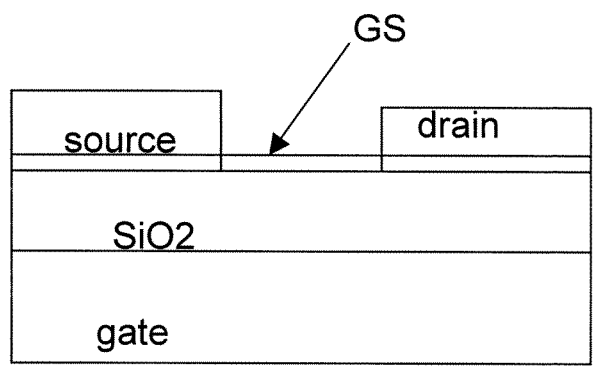
FIG. 8 is a schematic drawing of an embodiment of a GS layer in an electronic device, where the GS layer is disposed on an insulator between a source and drain.
Figure 10:
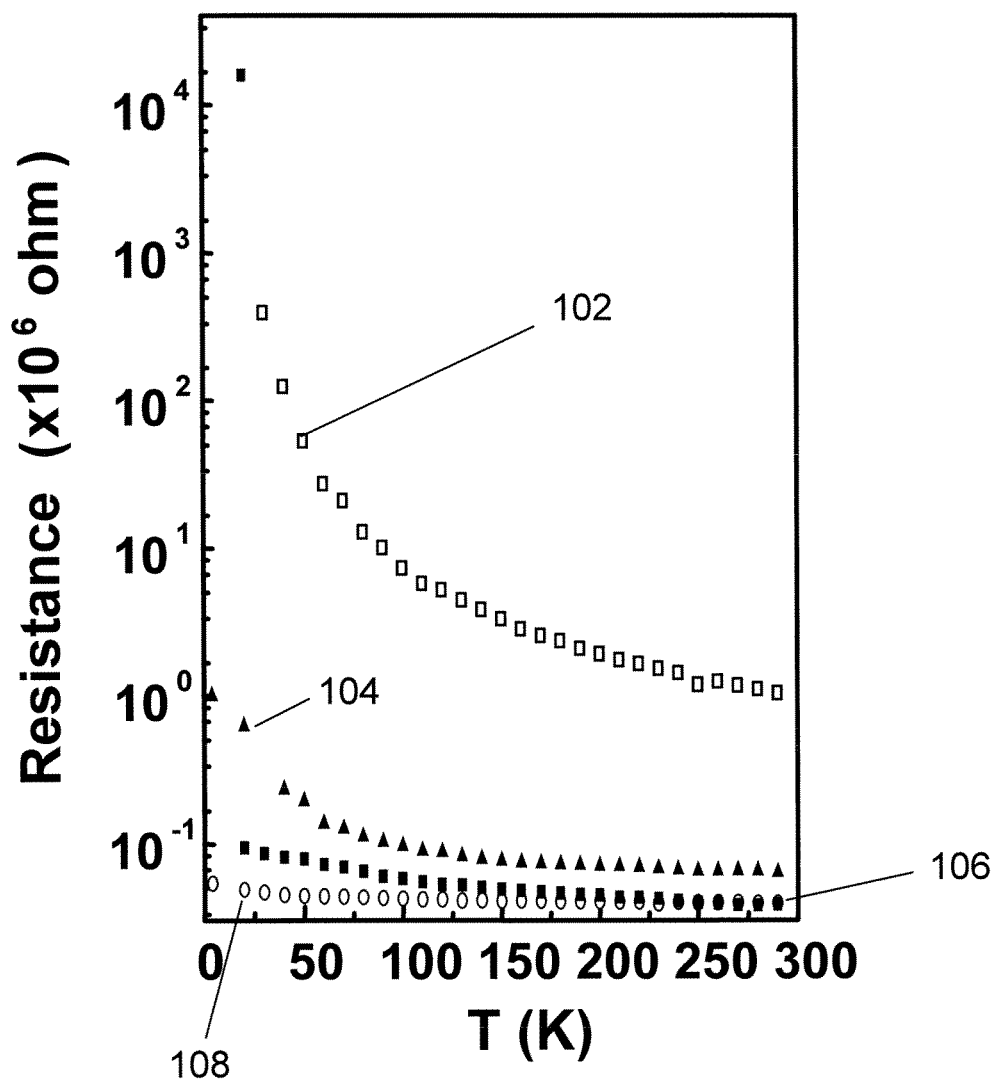
FIG. 10 is a line graph showing a mean resistance of as-made GS, annealed GS and annealed GO at various temperatures. The resistance of GS, especially the annealed GS showed only very small conductance drop (similar to some of the peel-off pristine graphene samples reported in the literature) at low temperature. Curve 106 is the resistance of 800° C. annealed GS (Ti/Au contact); curve 102 is the resistance of 800° C. annealed GO; curve 104 is the resistance of as-made GS; curve 108 is the resistance of 800° C. annealed GS (Pd contact).

Single GS electrical devices with as-made and annealed GS and Hummer's GO were fabricated, as shown in FIG. 8, with a source, drain and GS in between bridging the channel. As shown in FIG. 8, a conventional gate has applied to it a layer of silicon dioxide upon which a graphene sheet was applied. Then, source and drain materials were layered on top of the graphene sheet (GS). As-made GO devices without annealing were all electrically insulating. This result strongly supported the proposed atomic structures of GS and GO, discussed above in connection with the schematic structures, and the idea that our GS are nearly pristine graphene. After thermal annealing to remove oxygen species, the present GS sheet retained high electrical conductivity with only slight increase in resistance at low temperatures (for both Pd and Ti/Au contacted devices), in strong contrast to annealed GO that were insulating at low temperatures (FIG. 10). Devices of as-made GS showed reduced metallic characteristics over annealed GS devices (but were still >1000 times more conducting than GO devices) with larger increase in resistance at low T (FIG. 10). This suggested that the as-made GS contained a small amount of disorder in the structures.

Organic Stability of GS, and Preparation of Langmuir-Blodgett (LB) Films

As described in the example below, large quantities of GS were transferred from DMF to organic solvent DCE with excellent stability against agglomeration. The fact that the as-made GS was stably suspended in DCE without additional surfactant indicates high hydrophobicity of the graphene, consistent with low degree of graphene oxidation and covalent functionalization. In contrast, Hummer's GO were highly hydrophilic and completely insoluble in organic solvents. The organic stability of the present GS enabled Langmuir-Blodgett (LB) films to be made on various transparent substrates including glass and quartz for producing transparent and conducting films. This was done by adding GS suspensions onto water subphase, vaporizing the DCE solvent from water surface, compressing the floating GS and transferring the GS LB film onto a substrate by dip-coating. The GS floated on water due to hydrophobicity within the sheet. The edges of GS contain functional groups, giving rise to planar amphiphilic species. We were able to transfer GS repeatedly to achieve multi-layer films.

Figure 11:
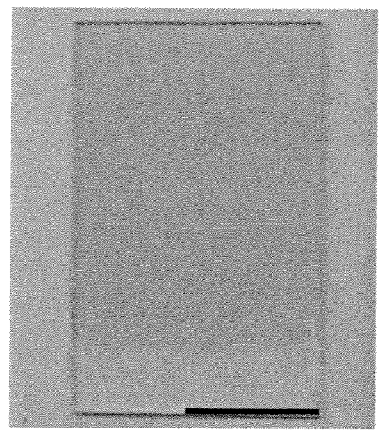
FIG. 11 shows a photograph of two-layer graphene sheet and LB film with part of it left clear. Scale bar is 10 mm.
Figure 12A:
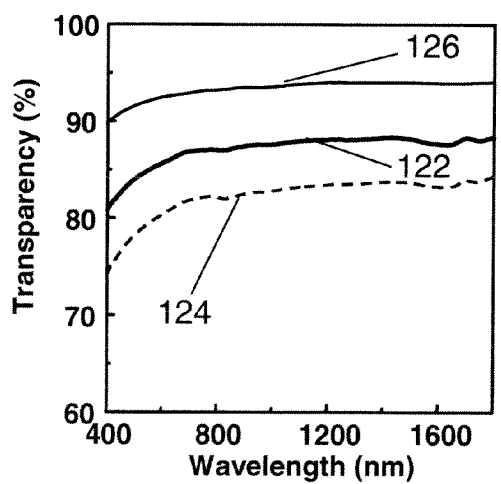
FIG. 12A shows transparency spectra of 1- (curve 126), 2- (curve 122), and 3- (curve 124) layer GS LB film. The transparency was defined as the transmittance at 1000 nm wavelength.
Figure 12B:
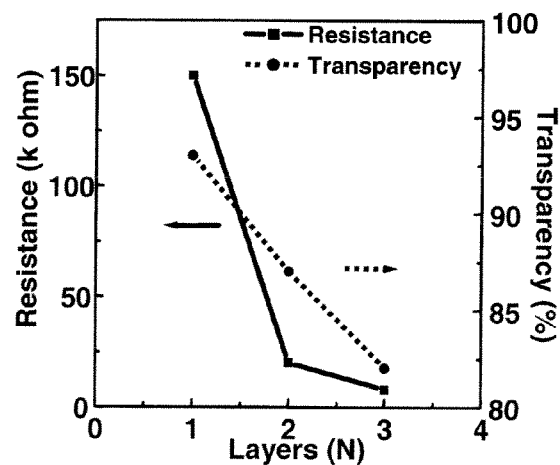
FIG. 12B shows resistance and transparency of 1-, 2-, and 3-layer LB film. The small percentage of bi-layer and few-layer GS in our sample and GS overlapping in the LB film over the substrate contributed to the transparency loss.

The 1-, 2-, and 3-layer LB films on quartz (FIG. 11) afforded a sheet resistance of ~150 k, 20 k, and 8 k ohm at room temperature (FIG. 12B) and a transparency (defined as transmittance at 1000 nm wavelength) of ~93%, 88% and 83% respectfully (FIGS. 12A and B). With 3-layer LB film, we can easily reach 8 kΩ sheet resistance with the transparency higher than 80%, which compares favorably over reduced GO films.[11, 12] The conductance and transparency of the present films are comparable to those made of graphene sheets formed by sonication of natural graphite in dimethylformamide.[31] This is believed to be the first time that high quality graphene sheets were assembled by the LB technique in a layer-by-layer manner on large substrates. Note that with the same method, GS using pristine graphite flakes as the starting material were also prepared, and the structural, electrical and spectroscopic properties of the GS made from pristine flakes are similar to those made from expandable graphite. Thus, the present large-scale synthesis of graphene sheet and the ability of processing them in various solvents for assembly open up the door to high-performance, scalable applications such as solar cells using transparent conducting films. Using LB techniques, and owing to the high solubility of the graphene materials prepared by the current method, many layers (e.g., thousands) of graphene sheet can be applied together to build up a transparent material that could be applied to the surface of a photovoltaic cell, or other electronic or electrochemical device. Further details on building up multiple layers may be found, e.g., in US 2007/0158789 by Faris, published Jul. 12, 2007, entitled "Material comprising predetermined number of atomic layers and method for manufacturing predetermined number of atomic layers."

In one embodiment, the present materials assembled by layers of LB films could be used as the anode material of a lithium ion battery. The layered GS could allow Li intercalation very well, giving high capacity batteries. In a lithium ion battery, lithium is extracted from the lithium containing anode material while lithium is concurrently inserted into the cathode on discharge of the battery. The reverse processes occur on recharge of the battery. Further details may be found in U.S. Pat. No. 5,624,606 to Wilson, et al., issued Apr. 29, 1997, entitled "Carbonaceous host compounds and use as anodes in rechargeable batteries."

Use of Graphite Flakes Rather than Expandable Graphite

As exemplified below, the present process enables the preparation of graphene sheets from graphite flakes, omitting the use of expandable graphite. In additional examples it is demonstrated that the preparation of smaller graphene molecules can be carried out in a process, which omits the insertion of TBA as a second intercalant, illustrated in FIG. 1A-C. In the case of smaller molecules, including nanoribbons and smaller molecules such as C42 and C222, the oxidizing acid provides intercalation and also functionalizes the edges the molecules, as indicated by the "X" groups. X is an oxygen-containing group, such as hydroxyl, carbonyl, epoxy, nitrate, sulfate etc. The nature of the X group will depend on the nature of the acid intercalating and functioning reagent. The intercalating base is used in the case of larger graphene materials, such as graphene sheets, which are bonded together more strongly by forces between the sheets. Importantly, the graphene sheets, ribbons and small molecules contain functional groups at the edges, but the internal aromatic rings are intact ("pristine.") The use of oleum or other strong oxidizing acids create oxygen-containing groups at the edge of the molecules, which groups both serve to make the molecules soluble in organic and aqueous solvents, preferably polar organic polar solvents such as DMF and chloroform.

Uses of Molecules

Figure 16A:
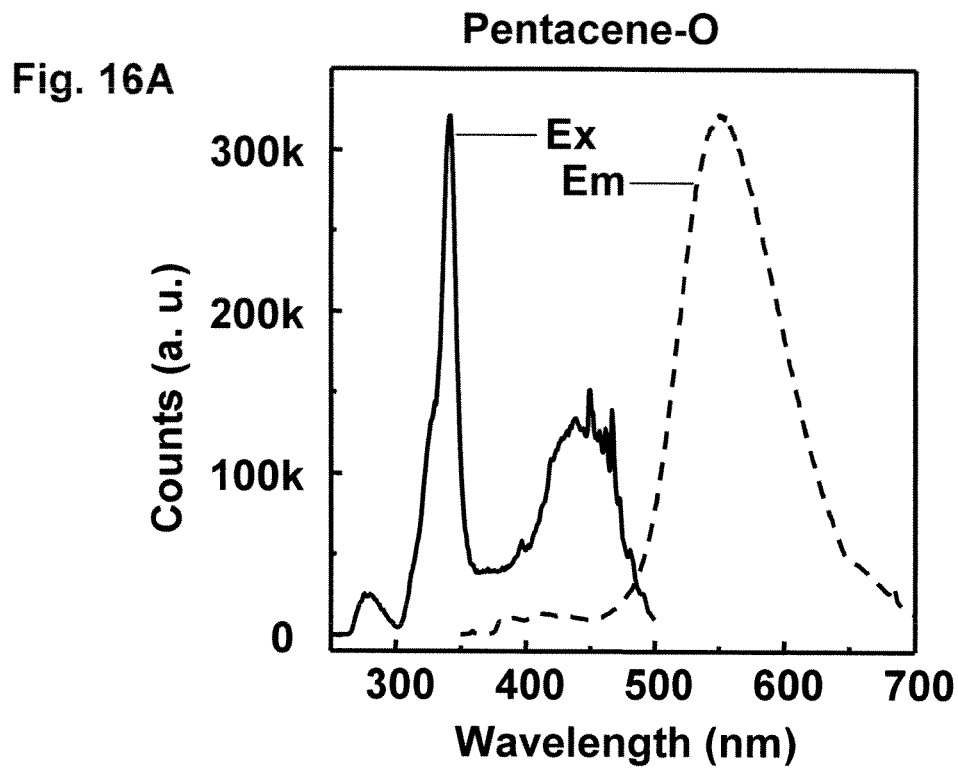
FIGS. 16A, 16B and 16C shows corresponding data showing that the fluorescence spectra, with wavelengths of maximum excitation and emission being consistent with the illustrated molecular formulas for pentacene (FIG. 16A), rubrene (FIG. 16B) and coronene (FIG. 16C).
Figure 16B:
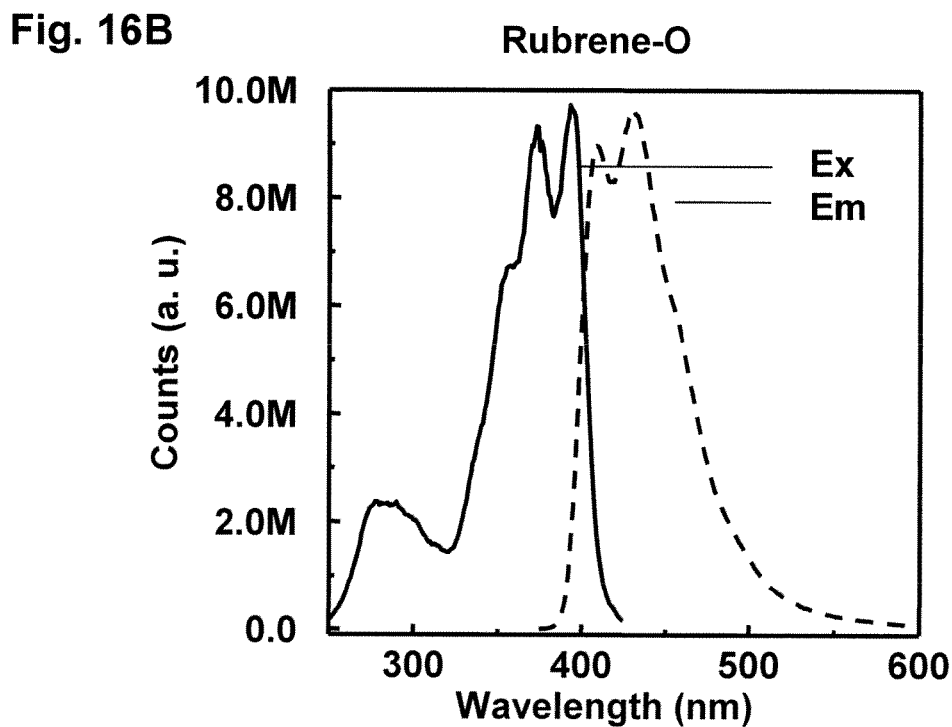
Figure 16C:
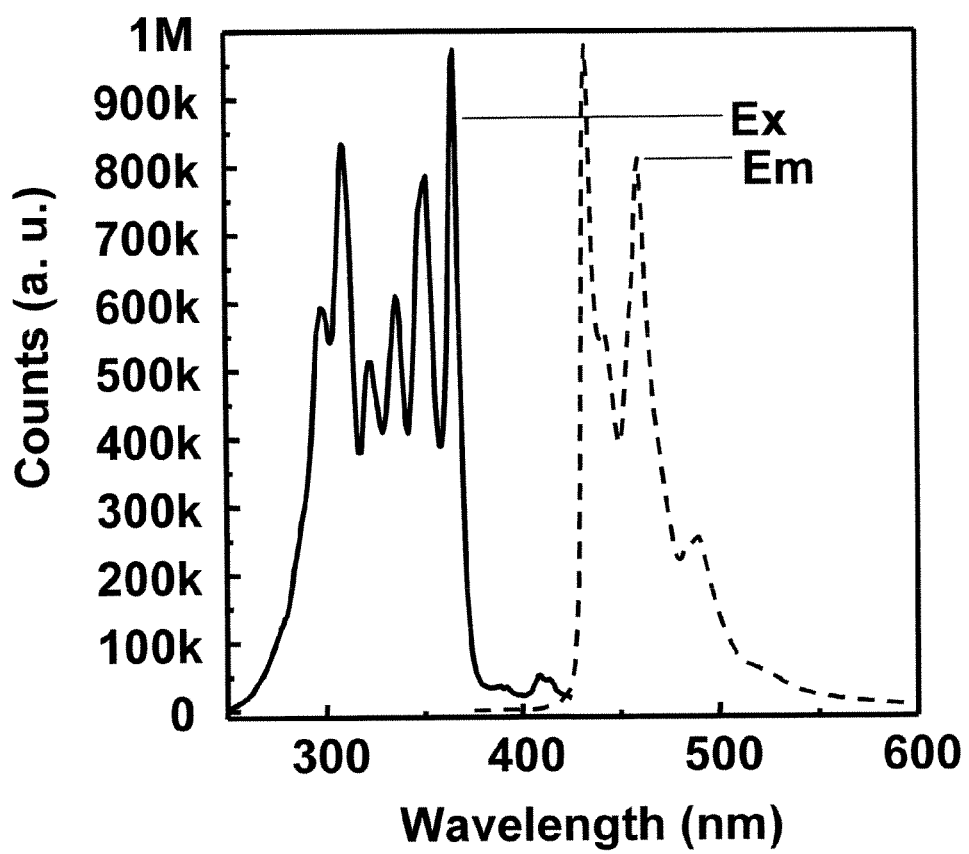

The present functionalized small molecules are useful as fluorescent dyes. As shown in FIG. 16A-C, the functionalized pentacene, rubrene and coronene have strong fluorescence excitation peaks and emission peaks at about 350/600 nm (pentacene), 400/450 nm (rubrene) and 390/450 (coronene). Furthermore, the degree of functionalization can be controlled by heating or using a secondary acid or oxidizing agent. Many suitable strong oxidizing agents are known, such as potassium ferricyanide, potassium dichromate, perchloric acid, ozone, etc. Further oxidation will shift the peak to the shorter wavelength region (blue shift). Thus, a series of very chemically similar dyes with different wavelengths can be prepared using the methods described here, and varying only the acid reaction conditions. Further details on the use of dyes, electroluminescent or photoluminescent chemicals made according to the present processes may be found, e.g., in US H2,084 to Picciolo, et al., issued Oct. 7, 2003, entitled "Pentacene derivatives as red emitters in organic light emitting devices," U.S. Pat. No. 6,720,092 to Hatwar, issued Apr. 13, 2004, entitled "White organic light-emitting devices using rubrene layer," The present functionalized compounds may also be used in composite materials, as disclosed in US 2007/0158618 to Song; et al., published Jul. 12, 2007, entitled "Highly conductive nano-scaled graphene plate nanocomposites and products."

EXAMPLES

Example 1: Preparation of Graphene Sheet (GS) Suspension

The single layer graphene sheets (GS) preparation started by exfoliating expandable graphite (160-50N of Grafguard Inc.) at 1000° C. in forming gas for 60 s. Then exfoliated graphite (~10 mg) was ground with NaCl crystallites for 3 mins forming a uniform grayish mixture. Small pieces of exfoliated graphite were separated and collected by dissolving NaCl with water and filtration. The resulting sample was then treated with oleum at room temperature for a day. After complete removal of acid by filtration and repeated washing, the resulting sample was ultra-sonicated using a cup-horn sonicator in DMF (10 mL) solution of TBA (130 µl) for 5 mins. The suspension was put at room temperature for 3 days to let the TBA fully inserted into graphene layers. Then 5 mL suspension was taken out and bath-sonicated with DSPE-mPEG (Laysan Bio. Inc., Arab, Ala.) (15 mg) for 1 hr forming a homogeneous suspension. After centrifuging the suspension at 24 kg for 3 mins, we obtained black suspension with mostly single layer GS retained in the supernatant.

Example 2: Characterization of GS

AFM (atomic force microscopy) images of GS were taken with a Nanoscope IIIa multimode instrument. The samples were prepared by soaking a $SiO_2$ substrate (pretreated by 4 mM 3-aminopropyl-triethoxysilane (APTES) water solution for 20 mins) into the graphene suspension for 20 mins, rinsing with water and blow-dry with Argon. The substrate was calcined to 350° C. and annealed at 800° C. in $H_2$ before AFM. IR spectrum (400 to 4000 $cm^{-1}$) was measured using Nicolet IR100 FT-IR Spectrometer with pure KBr as the background. After removal of the surfactant by filtration and repeated washing, graphene sample was collected and ground with KBr. The mixture was dried and compressed into a transparent tablet for measurement. We characterized our GS by a JEOL 2010F FEG transmission electron microscope (TEM) at an accelerating voltage of 120 kV. The TEM samples were prepared by drying a droplet of the graphene suspension on a lacey carbon grid. High resolution XPS measurement was carried out using SSI S-Probe Monochromatized XPS Spectrometer, which uses Al ($K\alpha$) radiation as a probe. Analysis spot size is 150 micron by 800 micron. Sample preparation involved removal of the surfactant by filtration and repeated washing, depositing materials onto a silicon substrate by repeated drop-drying. GO sample was prepared by depositing materials onto a silicon substrate by repeated drop-drying. HOPG sample was used for XPS measurement without any treatment.

Figure 13A:
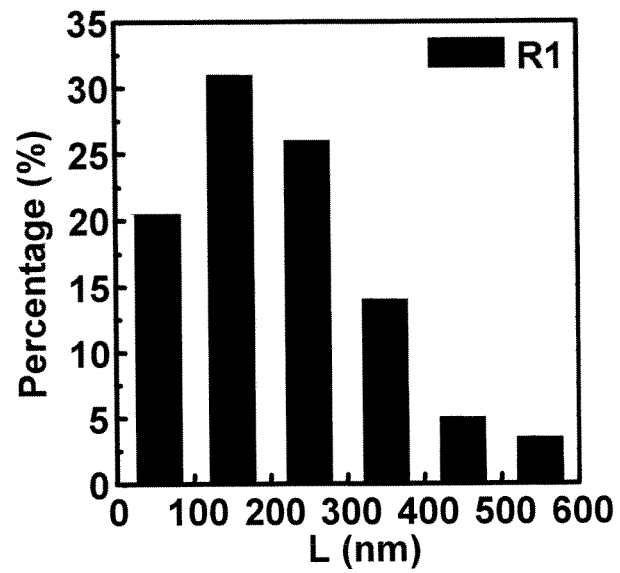
FIG. 13 is a histogram showing dimension measurements of obtained from >100 graphene sheets. Length is shown in FIG. 13A; width is shown in FIG. 13B.
Figure 13B:
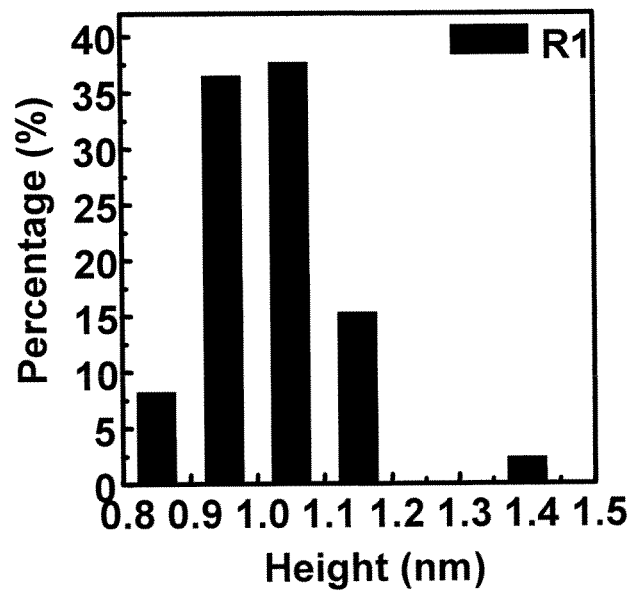

Height data are given in FIG. 13B. These figures are based on size and height of >100 graphene sheets. Based on the AFM results, about 90% of the samples are single layer graphene sheets. The rest of the samples are two- or multi-layer graphene sheets. These single layer GS have an average size of about 250 nm and height of about 1 nm. The height measurement of the present single layer graphene was also consistent with the reported AFM results on few-layer graphene sheets, where the single layer graphene is always ~1 nm.

Example 3: GS and GO (Graphene Oxide) Device Fabrication

Figure 7:
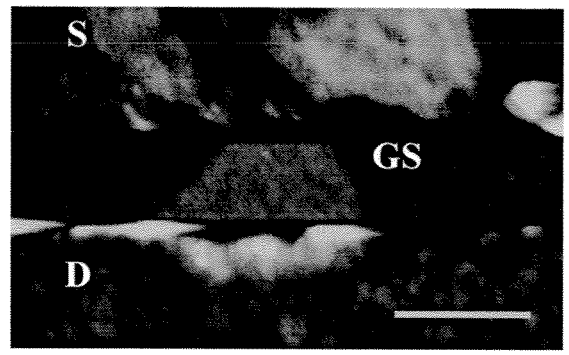
FIG. 7 shows an AFM image of a typical device with single graphene sheet (GS, thickness~1 nm, single layer) bridging the channel (channel length L~100 nm GS with TiAu contacts and Si back-gate) between source (S) and drain (D) electrodes. Scale bar is 200 nm.
Figure 9:
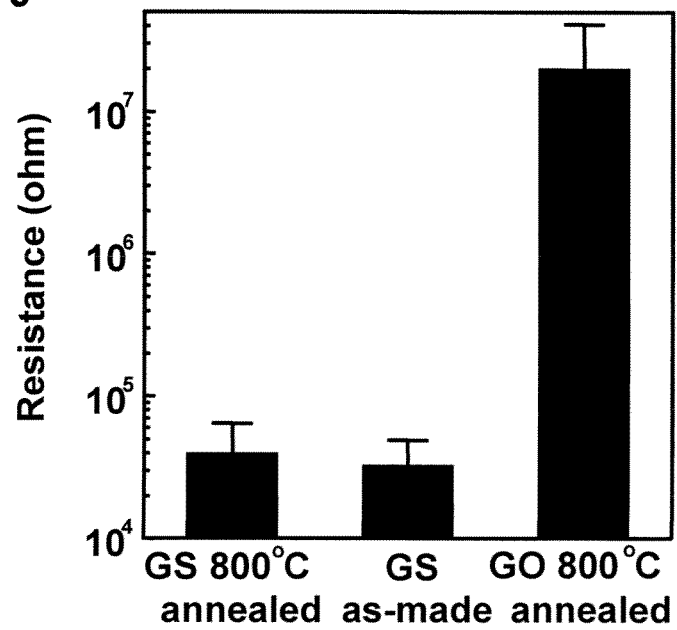
FIG. 9 shows a mean resistance histogram of 10 devices of as-made GS, annealed GS and annealed GO. The resistance of as-made GS and annealed GS were similar (within the error bars of statistical variations between GS devices) indicating the high quality of our as-made GS.

Electronic devices were constructed as shown in FIGS. 7 and 8. Palladium (Pd) or titanium/gold (Ti/Au) were used as source/drain (S/D) metal contacts (channel length L~100 nm), a $P^{++}$-Si backgate, and 500 nm $SiO_2$ as gate dielectrics. Typical resistance of ~100 nm wide GS (FIG. 7) at room temperature is 10-30 kΩ (FIG. 9 and FIG. 10). The average resistance histogram (error bar is the standard deviation) for large numbers of devices showed that room-temperature resistance of as-made GS was similar to those of annealed GS devices (for both Pd and Ti/Au contacted devices), and about 100 times lower than annealed GO (FIG. 9). GS and GO were deposited onto 500 nm $SiO_2/P^{++}$ Si substrate (Pre-treated with 4 mM APTES solution). After removal of the surfactant by 350° C. calcination and 800° C. $H_2$ annealing, electron-beam lithographic patterning followed by electron-beam evaporation of Pd (20 nm) or Ti (1.5 nm)/Au (20 nm) were used to form source and drain electrodes (channel length ~100 nm, width ~2 micron) on the substrate randomly. The sample was then annealed in argon at 300° C. for 15 min to improve the contacts between the source and drain metal and the GS/GO in the channel region.

Example 4: Langmuir-Blodgett Film (LB) Film Fabrication

A DMF suspension of GS was centrifuged at 24 kg for 1 hr to remove the surfactants. The aggregates were then re-suspended in fresh DMF by brief sonication. This centrifugation and re-suspending process was repeated for 3 times. One may then re-suspend the GS samples in fresh DCE and repeat the centrifugation and re-suspending process for 3 times to ensure complete removal of DSPE-mPEG. The resulting GS were suspended in DCE by 5 mins sonication. GS LB films were made using a commercial KSV-Minimicro 2000 LB trough. About 1.2 mL of GS/DCE suspension was added to a water subphase in the LB trough. A platinum plate was used to monitor the surface tension during compression of the GS on the water subphase by moving the two opposing barriers towards each other. At a target surface pressure of ~27 mN/m, GS were compressed to form a dense LB film transferable onto a solid substrate (up to 1×1 $in^2$) by slowly pulling up the substrate out of the aqueous subphase. The transferred GS LB film was typically calcined at 350° C. to remove DSPE-mPEG and TBA residues before transparency and resistance measurement. After calcination the quartz substrate with 1 layer LB film, another layer GS film was then transferred onto it by repeating the LB making procedure. Multi-layer LB films were obtained by this layer-by-layer transfer method. Transparency of the GS films was measured with Cary 6000i spectrophotometer using pure quartz as the background. The transparency was defined as the transmittance at 1000 nm wavelength.

Example 5: Other Graphitic Structures

Figure 14A:
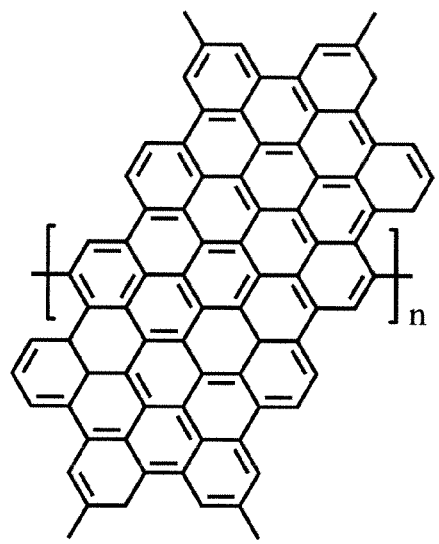
FIG. 14A is a drawing of an L graphene ribbon and FIG. 14B is a drawing of a D ribbon. In the L ribbon, "n" is the polymerization degree. It means the ribbon is made by 'n' units of the structure in the bracket. In the D ribbon, x, y and z mean that the D ribbon is made by 'x' units of the structure in the first bracket, 'y' units of the structure in the second bracket, 'z' units of the structure in the last bracket. These numbers depend on the dimensions of the ribbon and will range from 1 to about 10,000.
Figure 14B:
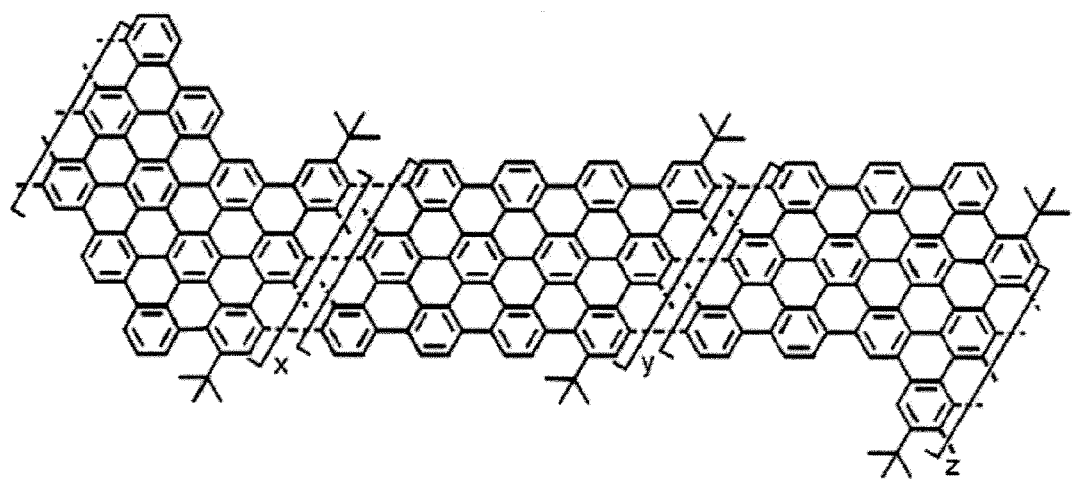

The present methods have been used to prepare other materials, in addition to the graphene sheets described above. FIG. 14A shows the structure of schematic structure of L graphene ribbon prepared by the present method. AFM images of these ribbons suspended by PL-PEG in DMF after grinding, oleum treatment (soaking in oleum at room temperature for overnight), and TBA insertion (soaking in 0.5% TBA solution at room temperature for 3 days) confirmed results. FIG. 14B shows the schematic structure of D ribbon. AFM images of the D ribbons suspended by PL-PEG in DMF after grinding, oleum treatment (soaking in oleum at room temperature for overnight), and TBA insertion (soaking in 0.5% TBA solution at room temperature for 3 days) were obtained, and showed that ribbon suspensions were obtained.

Figure 15A:
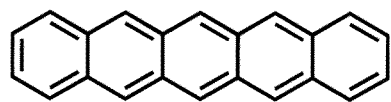
FIGS. 15A, 15B and 15C is a series of the structures of, respectively, pentacene, rubrene, and coronene, prepared in dispersed form according to the present process.
Figure 15B:
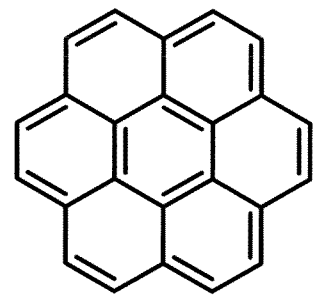
Figure 15C:
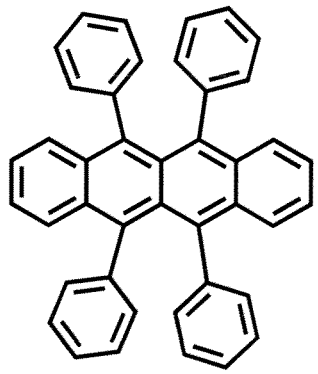

FIG. 15 shows the schematic structures of additional graphene molecules and their fluorescence spectra after oleum treatment. FIG. 15A is a schematic structure of pentacene. FIG. 15B is a schematic structure of rubrene. FIG. 15C is a schematic structure of coronene. FIGS. 16A, 16B and 16C correspondingly show fluorescence spectra of oleum treated (soaking in oleum at room temperature for overnight) pentacene (in DMF), rubrene (in water), and coronene (in water).

Figure 17A:
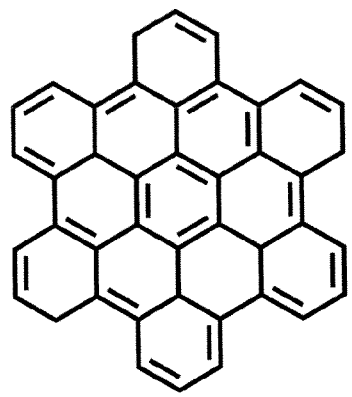
FIGS. 17A, 17B and 17C is a series of schematic drawings of additional molecules prepared in dispersed form, including C42, C222 (FIG. 17A) schematic structure of C42.
Figure 17B:
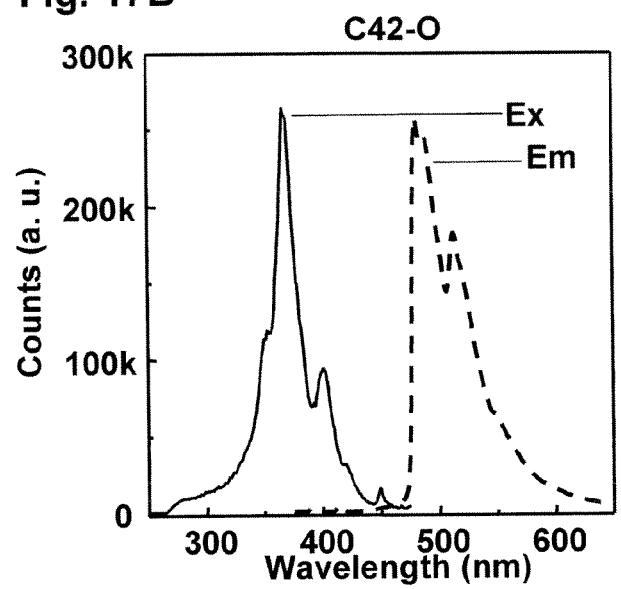
Figure 17C:
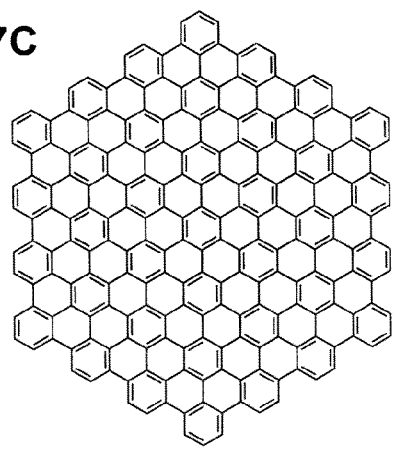
Figure 18:
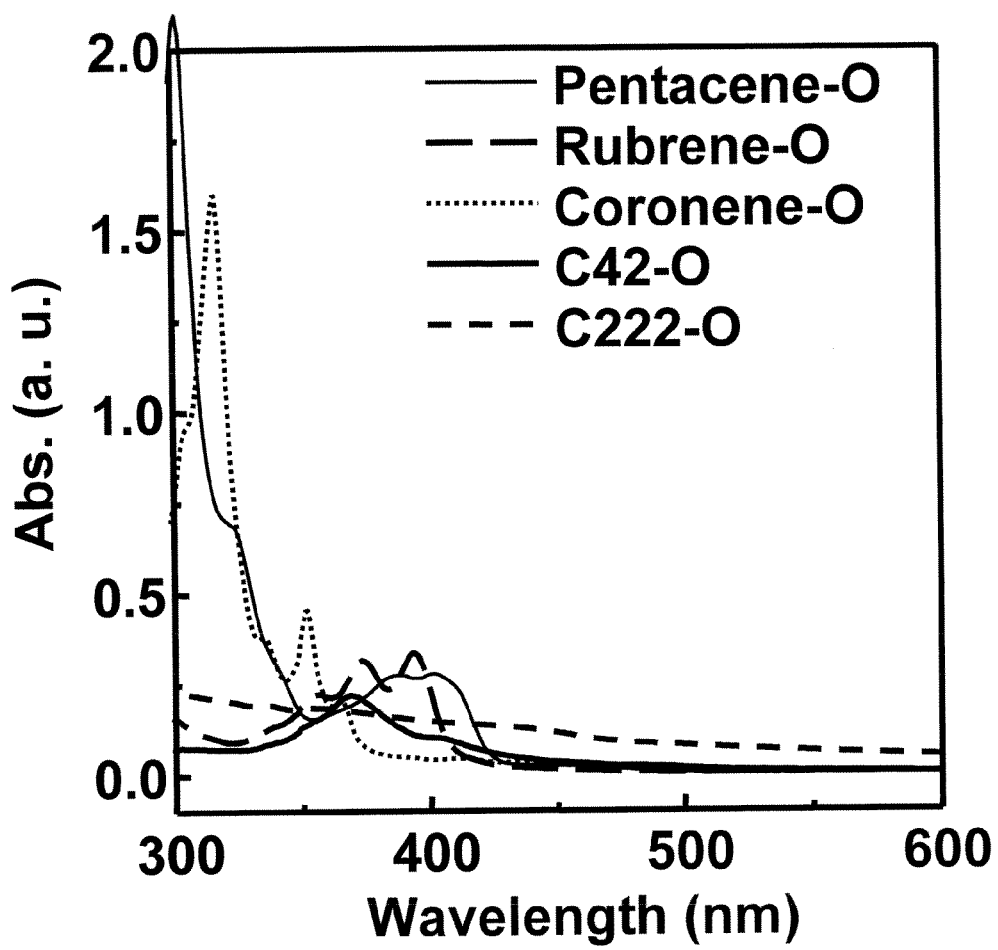
FIG. 18 is UV-vis spectra of oleum treated (soaking in oleum at room temperature for overnight) pentacene (in DMF), rubrene (in water), coronene (in water), C42 (in DMF), and C222 (in DMF). Again, fluorescence spectra were consistent with molecules of the illustrated structure.

FIG. 17 shows (17A) schematic structure of C42. FIG. 17B shows fluorescence spectra of oleum treated C42 (in DMF). FIG. 17C shows a schematic structure of C222. FIG. 18 shows UV-vis spectra of oleum treated (soaking in oleum at room temperature for overnight) pentacene (in DMF), rubrene (in water), coronene (in water), C42 (in DMF), and C222 (in DMF). The illustrated C42 and C222 are commercially available or can be synthesized by organic synthesis. Without treatment, these molecules, especially pentacene, C42, C222, D ribbon and L ribbons, are almost not soluble in any solvent. Rubrene and coronene are not soluble in water. The present method can make these insoluble graphene molecules soluble in organic solvents and make rubrene and coronene water-soluble without damage to the conjugate plane.

The various ribbons and graphene molecules used as starting materials in the examples were synthesized initially by organic chemistry methods with high purity and selectivity. Each synthesis method can produce a material containing nearly pure C222 or C42 or ribbons. The problem is that these species are in the form of aggregates.

Example 6: Preparation of Functionalized Graphene Sheets Using Graphite Flakes as Starting Material Natural graphite flakes (Superior Graphite Co., ~10 mg) were ground with NaCl crystallites for 3 mins forming a uniform grayish mixture. Small pieces of graphite flakes were separated and collected by dissolving NaCl with water and filtration. The resulting sample was then treated with oleum (about 5 ml) at room temperature for a day. After complete removal of acid by filtration and repeated washing, the resulting sample was ultra-sonicated using a cup-horn sonicator in DMF (10 mL) solution of TBA (130 µl) for 5 mins. The suspension was put at room temperature for 3 days to allow the TBA to fully be inserted into the graphene layers. Then, 5 mL of the suspension was taken out and bath-sonicated with DSPE-mPEG (Laysan Bio. Inc., Arab, Ala.) (15 mg) for 1hr forming a homogeneous suspension. After centrifuging the suspension at 24000 g for 3 mins, we obtained black suspension with mostly single layer GS retained in the supernatant.

Example 7: Preparation of Functionalized D Graphene Nanoribbons in Suspension A D-graphene nanoribbon was provided as a generous gift from Prof. Klaus Mullen's group, Germany. Preparation of such materials is described in Grimsdale and Mullen, cited under Related Art. However, as stated, such materials are almost insoluble in any solvent. About ~10 mg of sample was ground for 3 mins. The resulting sample was then treated with oleum (about 20 ml) at room temperature for a day. After dilution of the acid to 500 ml solution, sodium carbonate was used to do the neutralization. The resulting sample was centrifuged down from water solution at 5000 g for 15 min. Then, the sample was transferred to DMF and sonicated using a bath sonicator in DMF (5 mL) solution of TBA (65 µl) for 15 mins. The suspension was put at room temperature for 3 days to let the TBA fully inserted into graphene layers. Then the suspension was bath-sonicated with DSPE-mPEG (Laysan Bio. Inc., Arab, Ala.) (15 mg) for 15 min forming a homogeneous suspension. After centrifuging the suspension at 24000 g for 1 hr, a black suspension with D ribbons (dispersed by the surfactants, probably with sulfurate groups at the edges) retained in the supernatant was obtained.

Example 8: Preparation of Functionalized L Nanographene Ribbons in Suspension As-received L-graphene nanoribbon sample (a gift from Prof. Klaus Mullen's group, as referenced in Example 7, almost insoluble in any solvent) (~10 mg) was ground for 3 min. The resulting sample was then treated with oleum (about 20 ml) at room temperature for a day. After dilution of the acid to 500 ml solution, sodium carbonate was used to do the neutralization. The resulting sample was centrifuged down from water solution at 5000 g for 15 min. Then the sample was transferred to DMF and sonicated using a bath sonicator in DMF (5 mL) solution of TBA (65 µl) for 15 mins. The suspension was put at room temperature for 3 days to let the TBA fully insert into graphene layers. Then the suspension was bath-sonicated with DSPE-mPEG (Laysan Bio. Inc., Arab, Ala.) (15 mg) for 15 min forming a homogeneous suspension. After centrifuging the suspension at 24000 g for 1 hr, a black suspension with L ribbons (dispersed by the surfactants, probably with sulfurate groups at the edges) retained in the supernatant was obtained.

Example 9: Preparation of Functionalized C222 Molecules in Suspension

C222 sample was synthesized following Simpson et al., reference 35, and, as above, was almost insoluble in any solvent. About 10 mg of this material was ground for 3 min. The resulting sample was then treated with oleum (about 20 ml) at room temperature for a day. After dilution of the acid to 500 ml solution, sodium carbonate was used to neutralize the solution. The resulting sample was centrifuged down from water solution at 5000 g for 15 min. Then the sample was transferred to DMF and sonicated using a bath sonicator in DMF (5 mL) solution of TBA (65 µl) for 15 mins. The suspension was put at room temperature for 3 days to let the TBA fully inserted into graphene layers. Then the suspension was bath-sonicated with DSPE-mPEG (Laysan Bio. Inc., Arab, Ala.) (15 mg) for 15 min., forming a homogeneous suspension. After centrifuging the suspension at 24000 g for 1 hr, a black suspension with C222 (dispersed by the surfactants, probably with sulfurate groups at the edges) retained in the supernatant was obtained.

Example 10: Preparation of Functionalized Pentacene in Suspension

Pentacene (Sigma Aldrich, almost insoluble in any solvent) (~10 mg) was treated with oleum (about 5 ml) at room temperature for a day. After dilution of the acid to 50 ml solution, sodium carbonate was used to neutralize the solution. The resulting sample was centrifuged down from water solution at 5000 g for 15 min. Then the sample (isolated molecules probably with sulfate groups and carbonyl groups ($C=O$) at the edge) was dissolved in DMF by brief sonication (less than 1 min).

Example 11: Preparation of Functionalized Rubrene in Suspension

Rubrene (Sigma Aldrich, soluble in DCE, chloroform but not soluble in water) (~10 mg) was treated with oleum (about 5 ml) at room temperature for a day. After dilution of the acid to 50 ml solution, sodium carbonate was used to do the neutralization. The resulting sample (isolated molecules probably with sulfate groups at the edges) was soluble in water solution at all acid, neutral, and base condition.

Example 12: Preparation of Functionalized Coronene in Suspension

Coronene (Sigma Aldrich, soluble in DCE, chloroform but not soluble in water) (~10 mg) was treated with oleum (about 5 ml) at room temperature for a day. After dilution of the acid to 50 ml solution, Sodium carbonate was used to do the neutralization. The resulting sample (isolated molecules probably with sulfurate groups at the edges) was soluble in water solution at all acid, neutral, and base condition.

Example 12: Preparation of Functionalized C42 in Suspension

C42 was synthesized following Grimsdale and Mullen, reference 33, and found to be slightly soluble in DMF. However, solubility increased dramatically after the present treatment. About 10 mg of as received C42 was treated with oleum (about 5 ml) at room temperature for a day. After dilution of the acid to 50 ml solution, sodium carbonate was used to neutralize the solution. The resulting sample was centrifuged down from water solution at 5000 g for 15 min. Then the sample (isolated molecules probably with sulfurate groups at the edges) was dissolved in DMF by brief sonication (less than 1 min).

CONCLUSION

The above specific description is meant to exemplify and illustrate the invention and should not be seen as limiting the scope of the invention, which is defined by the literal and equivalent scope of the appended claims. Any patents or publications mentioned in this specification, including the references cited below are indicative of levels of those skilled in the art to which that patent or publication pertains as of its date and are intended to convey details of the invention which may not be explicitly set out but which would be understood by workers in the field. Such patents or publications are hereby incorporated by reference to the same extent as if each was specifically and individually incorporated by reference, as needed for the purpose of describing and enabling the method or material referred to.

REFERENCES

1. Geim, A. K. & Novoselov, K. S. The rise of graphene. *Nature Materials* 6, 183-191 (2007).
2. Novoselov, K. S., et. al. Electric Field Effect in Atomically Thin Carbon Films. *Science* 306, 666-669 (2004).
3. Novoselov, K. S., et. al. Two-dimensional gas of massless Dirac fermions in graphene. *Nature* 438, 197-200 (2005).
4. Zhang, Y. B., Tan, Y. W., Stormer, H. L. & Kim, P. Experimental observation of the quantum Hall effect and Berry's phase in graphene. *Nature* 438, 201-204 (2005).
5. Berger, C., et. al. Electronic Confinement and Coherence in Patterned Epitaxial Graphene. *Science* 312, 1191-1196 (2006).
6. Novoselov, K. S., et. al. Two-dimensional atomic crystals. *Proc. Natl. Acad. Sci. U.S.A.* 102, 10451-10453 (2005).
7. Berger, C., et. al. Ultrathin Epitaxial Graphite: 2D Electron Gas Properties and a Route toward Graphene-based Nanoelectronics. *J. Phys. Chem. B* 108, 19912-19916 (2004).
8. Dikin, D. A., et. al. Preparation and characterization of graphene oxide paper. *Nature* 448, 457-460 (2007).
9. Stankovich, S., et. al. Stable aqueous dispersions of graphitic nanoplatelets via the reduction of exfoliated graphite oxide in the presence of poly(sodium 4-styrene-sulfonate). *J. Mater. Chem.* 16, 155-158 (2006).
10. Stankovich, S., et. al. Synthesis of graphene-based nanosheets via chemical reduction of exfoliated graphite oxide. *Carbon* 45, 1558-1565 (2007).
11. Gilje, S., Han, S., Wang, M. S., Wang, K. L. & Kaner, R. B. A chemical route to graphene for device applications. *Nano Lett.* 7, 3394-3398 (2007).
12. Li, D., Muller, M. B., Gilje, S., Kaner, R. B. & Wallace, G. G. Processable aqueous dispersions of graphene nanosheets. *Nature Nanotech.* 3, 101-105 (2008).
13. Gomez-Navarro, C., et. al. Electronic transport properties of individual chemically reduced graphene oxide sheets. *Nano Lett.* 7, 3499-3503 (2007).
14. Wang, X., Zhi, L. J. & Mullen, K. Transparent, conductive graphene electrodes for dye-sensitized solar cells. *Nano Lett.* 8, 323-327 (2008).
15. Bourlinos, A. B., et. al. Graphite oxide: chemical reduction to graphite and surface modification with primary aliphatic amines and amino acids. *Langmuir* 19, 6050-6055 (2003).
16. Hummers, W. S. & Offeman, R. E. Preparation of graphite oxide. *J. Am. Chem. Soc.* 80, 1339 (1958).
17. Tan, Y. W., Zhang, Y. B., Stormer, H. L. & Kim, P. Temperature dependent electron transport in graphene. *Eur. Phys. J.* 148, 15-18 (2007).
18. Li, X. L., Wang, X. R., Zhang, L., Lee, S. W. & Dai, H. J. Chemically Derived, Ultrasmooth Graphene Nanoribbon Semiconductors. *Science* 319, 1229-1232 (2008).
19. Stankovich, S., et. al. Graphene-based composite materials. *Nature* 442, 282-286 (2006).
20. Schniepp, H. C., et. al. Functionalized Single Graphene Sheets derived from splitting graphite oxide. *J. Phys. Chem. B* 110, 8535-8539 (2006).

21. Yu, A. P., Ramesh, P., Itkis, M. E., Bekyarova, E. & Haddon, R. C. Graphite Nanoplatelet-Epoxy Composite Thermal Interface Materials. *J. Phys. Chem. C* 111, 7565-7569 (2007).
22. Niyogi, S., et. al. Solution properties of graphite and graphene. *J. Am. Chem. Soc.* 128, 7720-7721 (2006).
23. Meyer, J. C., et. al. The structure of suspended graphene sheets. *Nature* 446, 60-63 (2007).
24. Greinke, R. A., et al. (Graftech Inc., U.S., 2002).
25. Han, J. H., Cho, K. W., Lee, K. -H. & Kim, H. Porous graphite matrix for chemical heat pumps. *Carbon* 36, 1801-1810 (1998).
26. Ericson, L. M., et. al. Macroscopic, neat, single-walled carbon nanotube fibers. *Science* 305, 1447-1450 (2004).
27. Liu, Z. H., Wang, Z. M., Yang, X. J. & Ooi, K. Intercalation of organic ammonium ions into layered graphite oxide. *Langmuir* 18, 4926-4932 (2002).
28. Kam, N. W. S., O'Connell, M., Wisdom, J. A. & Dai, H. J. Carbon nanotubes as multifunctional biological transporters and near-infrared agents for selective cancer cell destruction. *Proc. Natl. Acad. Sci. U.S.A.* 102, 11600-11605 (2005).
29. Hontoria-Lucas, C., Lopez-Peinado, A. J., Lopez-Gonzalez, J. de D., Rojas-Cervantes, M. L. & Martin-Aranda, R. M. Study of oxygen-containing groups in a series of graphite oxides: physical and chemical characterization. *Carbon* 33, 1585-1592 (1995).
30. Kuznetsova, A., et. al. Enhancement of adsorption inside of single-walled nanotubes: opening the entry ports. *Chem. Phys. Lett.* 321, 292-296 (2000).
31. Blake, P., et. al. Graphene-based liquid crystal device. *Nano Lett.* (2008 ASAP).
32. Wu, J. S., et. al. From branched polyphenylenes to graphite ribbons. *Macromolecules,* 36, 7082-7089 (2003).
33. Grimsdale, A. C. & Mullen, K. The chemistry of organic nanomaterials. *Angew. Chem. Int. Ed.* 44, 5592-5629 (2005).
34. Herwig, P. T., Kayser, C. W., Mullen, K. & Spiess, H. W. Columnar mesophases of alkylated hexa-peri-hexabenzocoronenes with remarkably large phase widths. *Adv. Mater.* 8, 510-513 (1996).
35. Simpson, C. D., et al. Synthesis of a giant 222 carbon graphite sheet. *Chem. Eur. J.* 8, 1424-1429 (2002).

What is claimed is:

1. A method of making a graphene material in the form of a plurality of sheets dispersed in solution, which sheets are a single atom thick and which sheets further contain functional groups, said method comprising the steps of:
    (a) providing as a starting material a graphitic material in aggregated or insoluble form;
    (b) intercalating the graphitic material from step (a) with an acid;
    (c) forming a suspension of intercalated graphitic material from step (b) in a liquid medium;
    (d) agitating the suspension from step (c) to form dispersed sheets of graphene material reacted with the acid to form said functional groups at edges of said dispersed sheets but not on internal aromatic rings; and
    (e) recovering said graphene material as separate sheets from a solution formed in step (d), wherein said material is stable in the solution.

2. The method of claim 1 further comprising the step of exfoliating the graphitic material to form exfoliated graphite.
3. The method of claim 1 further comprising the step of exfoliating the graphitic material, said graphitic material being in the form of expandable graphite.
4. The method of claim 1 wherein said intercalating step further comprises the step of intercalating the graphitic material which has been intercalated with acid further by contacting the material with an organic base.
5. The method of claim 1 wherein the graphene material is one of dispersed sheets, ribbons or polyphenylene molecules.
6. The method of claim 1 wherein said reacting with acid to form functional groups forms functional groups selected from the group consisting of oxide, epoxide, carboxyl and hydroxyl.
7. A method of making a graphene material in the form of a plurality of sheets, ribbons or large graphene molecules dispersed in solution, which graphene material is a single atom thick, comprising the steps of:
    (a) providing as a starting material graphite flakes;
    (b) exfoliating the graphite flakes of step (a) to form exfoliated graphite;
    (c) intercalating the exfoliated graphite from step (b) with an acid and an organic base, forming a suspension in a liquid medium with or without the organic base;
    (d) agitating the suspension of step (c) to form dispersed sheets, ribbons or large graphene molecules, which are stable in solution; and
    (e) recovering from the suspension of step (d), respectively, individual graphene sheets, graphene ribbons or large graphene molecules a single atom thick from the solution.
8. The method of claim 7 wherein recovering is one of a graphene sheet, a graphene nanoribbon, a polyacene molecule, and a polyphenylene molecule.
9. The method of claim 7 wherein the intercalating acid comprises oleum.
10. The method of claim 7 wherein the organic base comprises TBA.
11. The method of claim 7 wherein the agitation comprises sonication.
12. The method of claim 7 further comprising a step of reducing recovered sheets to obtain nearly pristine graphene material.
13. The method of claim 12 further comprising the step of attaching the recovered sheet to an electrical device.
14. The method of claim 7 further comprising the step of placing the recovered sheet in an organic solvent and contacting it with an aqueous phase to prepare an LB film.
15. The method of claim 14 further comprising the step of attaching a recovered sheet as recited in step (d) to a transparent substrate.
16. The method of claim 15 wherein the recovered sheet is attached to a hydrophilic polymer.
17. The method of claim 15 wherein the hydrophilic polymer is PEG.
18. The method of claim 17 wherein the PEG is linked to the recovered sheet by a lipid.

* * * * *